United States Patent [19]
Sauerbrey et al.

[11] Patent Number: 5,689,428
[45] Date of Patent: Nov. 18, 1997

[54] INTEGRATED CIRCUITS, TRANSISTORS, DATA PROCESSING SYSTEMS, PRINTED WIRING BOARDS, DIGITAL COMPUTERS, SMART POWER DEVICES, AND PROCESSES OF MANUFACTURE

[75] Inventors: Roland Sauerbrey, Houston; Michael C. Smayling, Missouri City, both of Tex.

[73] Assignee: Texas Instruments Incorporated, Dallas, Tex.

[21] Appl. No.: 590,259

[22] Filed: Sep. 28, 1990

[51] Int. Cl.$^6$ .................................................. H01L 29/00
[52] U.S. Cl. .................................... 364/480; 364/492
[58] Field of Search ............................ 364/483, 492, 364/480; 307/495, 499, 248, 631; 338/15, 18; 430/78

[56] References Cited

U.S. PATENT DOCUMENTS

| | | | |
|---|---|---|---|
| 3,816,163 | 6/1974 | Yoldas | 65/324 |
| 4,098,654 | 7/1978 | Helle et al. | 204/16 |
| 4,702,792 | 10/1987 | Chow et al. | 156/628 |
| 4,707,394 | 11/1987 | Chant | 428/209 |
| 4,733,383 | 3/1988 | Waterbury | 368/10 |
| 4,772,804 | 9/1988 | Grimaud et al. | 307/10 LS |
| 4,839,219 | 6/1989 | Uekita et al. | 428/220 |
| 4,843,034 | 6/1989 | Herndon et al. | 437/189 |
| 4,853,277 | 8/1989 | Chant | 428/209 |
| 4,863,833 | 9/1989 | Fukuyama et al. | 430/286 |
| 4,906,966 | 3/1990 | Imamura et al. | 338/195 |
| 5,100,762 | 3/1992 | Tanaka et al. | 430/270 |
| 5,119,312 | 6/1992 | Gröger et al. | 364/483 |
| 5,376,502 | 12/1994 | Novak et al. | 430/270 |

FOREIGN PATENT DOCUMENTS

| | | |
|---|---|---|
| 0 263 574 | 4/1988 | European Pat. Off. . |
| 0 383 584 | 8/1990 | European Pat. Off. . |
| 28 37 800 | 3/1980 | Germany . |

OTHER PUBLICATIONS

J. Beard, "Quick-change plastic may make for cheaper chips", *New Scientist*, (1990) 15 Sep. No. 1734, Haywards Heath, GB, p. 36.

"Research Notes", *Electronics & Wireless World*, (1988) Dec., No. 1634, Sutton, Sussey, Gr. Britain, p. 1241.

*Chemical Abstracts*, vol. 103, 1985, p. 24.

Brief, "Variable-Resistivity Material for Memory Circuits", single page, NASA's Jet Propulsion Laboratory, 2301 NTIS Tech Notes (1990) Apr., Springfield, VA. US.

K. Mukai et al., "Planar Multilevel Interconnection Technology Employing a Polyimide" IEEE vol. SC-13, No. 4, Aug. 1978 pp. 462–467.

M Monnler, "Circuiterie Sur Film Polyimide", Tont L'Electronique Aug.–Sep. 1979 pp. 25–30.

Engineer-in-Training Reference Manual, Lindeburg, pp. 51–57, 1990.

*Primary Examiner*—Ellis B. Ramirez
*Assistant Examiner*—M. Kemper
*Attorney, Agent, or Firm*—Brian C. McCormack; Ira S. Matsil; Richard L. Donaldson

[57] ABSTRACT

An integrated circuit includes conductive elements and a radiation sensitive material interposed between the conductive elements and dosed to different conductivities in different portions thereof. Another aspect is a process of integrated circuit fabrication including steps of depositing a radiation sensitive material as a layer and variably dosing it with radiation to establish areas of higher and lower resistivity in the layer. A printed wiring board includes radiation sensitive material and the board further has a conductor layer affixed to the base. A transistor has a radiation sensitive material dosed to have two conductive regions separated by a gap of a lower conductivity in the radiation sensitive material, and a conductive substance deposited over the gap. These elements are useful in smart power devices, digital computers, controllers and electronic applications generally. Other devices, systems and processes are disclosed.

31 Claims, 21 Drawing Sheets

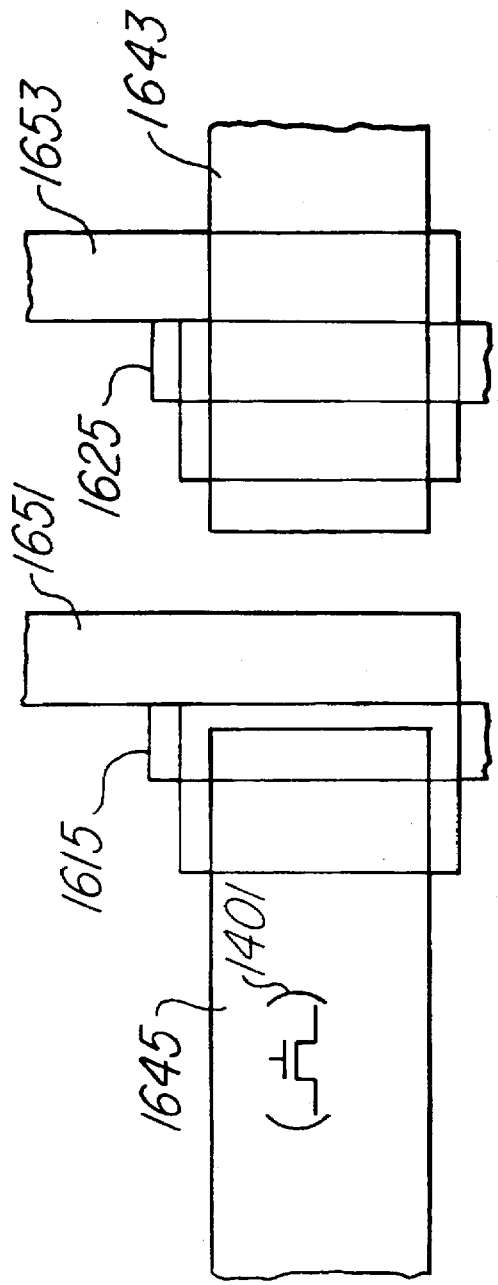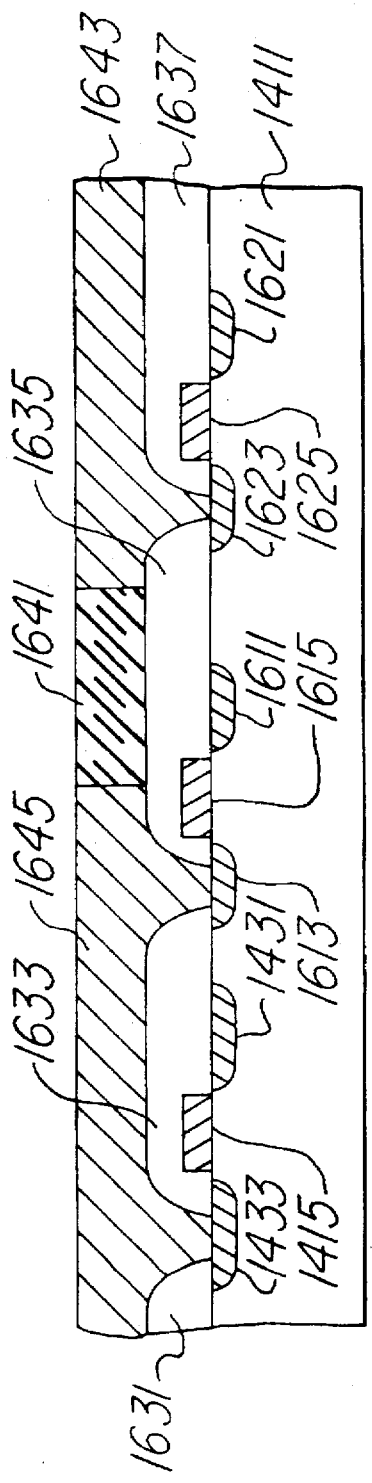
FIG. 42
FIG. 41

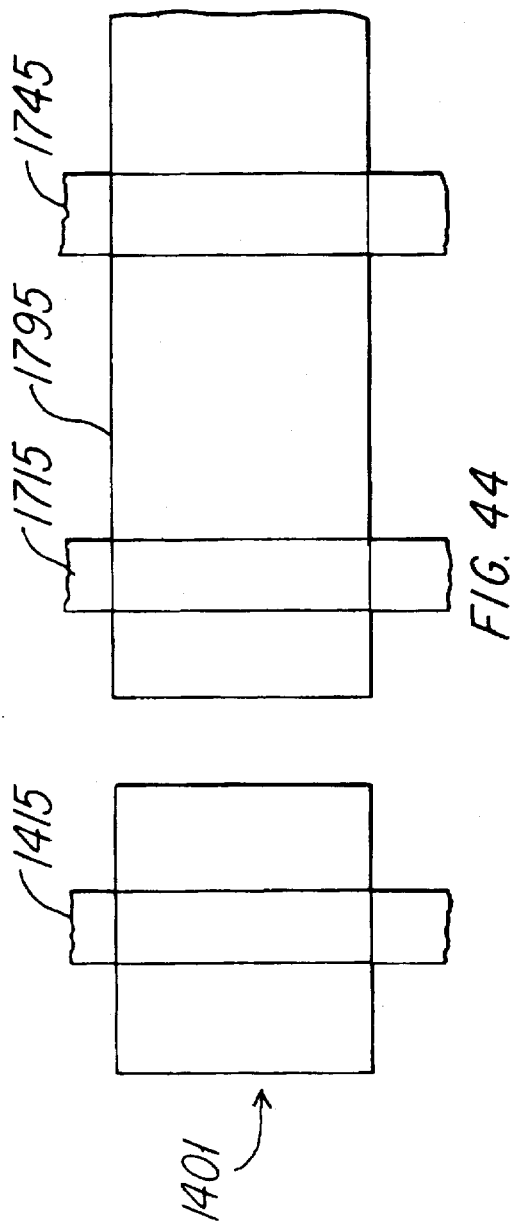
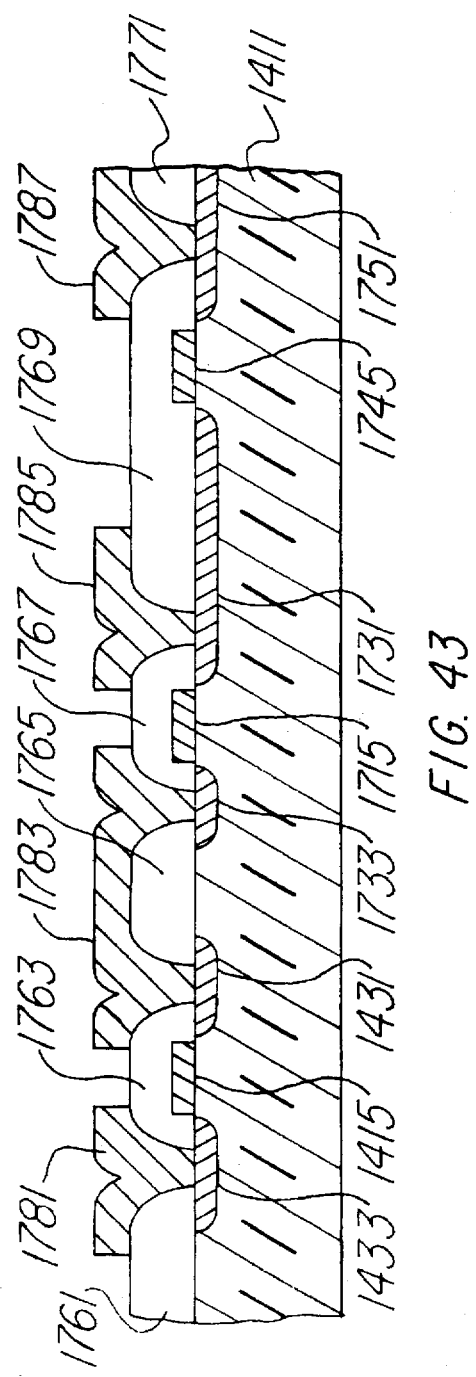
FIG. 44
FIG. 43

INTEGRATED CIRCUITS, TRANSISTORS, DATA PROCESSING SYSTEMS, PRINTED WIRING BOARDS, DIGITAL COMPUTERS, SMART POWER DEVICES, AND PROCESSES OF MANUFACTURE

BACKGROUND OF THE INVENTION

The field of the invention is in the manufacturing processing of integrated circuit (IC) chips, including IC packages and dies with transistors, interconnects and other microscopic elements and structures, and processing of printed wiring boards. The field of the invention also involves the printed wiring boards, IC packages, and IC dies themselves, as well as smart power devices and controllers, digital computers and data processing and other electronic systems.

Without limiting the scope of the invention its background is described in connection with chip fabrication.

IC chips can be made with metalization and dielectric material such as a CVD (chemical vapor deposition) oxide. Polyimides have also been proposed for the dielectric, see "Polyimides as Interlayer Dielectrics for High-Performance Interconnections of Integrated Circuits" by R. J. Jensen in Polymers For High Technology, American Chemical Society, 1987, Chapter 40.

A U.S. Pat. No. 4,702,792 describes a method in which Polymeric material is patterned to form openings and spaces, which are then filled with conductive material. Excess conductive material is removed by chemical-mechanical polishing to expose the polymeric material.

A coassigned application Ser. No. 455,210 filed Dec. 22, 1989, U.S. Pat. No. 5,313,102 discloses polyimide on the backside of an integrated circuit to prevent plastic encapsulated IC package cracking during surface mount, and that application is hereby incorporated herein by reference.

A problem of intermetal films is planarization or smoothing of the top surface to allow better deposition and definition of the subsequent metalization. Resist-etchback and spin-on-glass are techniques used to solve this problem, but both require additional processing.

Once the intermetal film is planar, vertical holes called vias are cut to allow connection between metal layers. The process for cutting vias involves deposition of photoresist, patterning, and etching of the film. Metal deposition into the vias is a problem, not to mention the complication of the fabrication process of forming vias and the problem is axacerbated as feature sizes decrease.

Raffel et al. in "Laser-formed connections using polyimide" Appl. Phys. Lett. 42(8), 15 Apr., 1983, pp. 705–6 described a technique with a layer of insulating polyimide overlying two metal conductors and the gap between them. When a shuttered argon ion laser beam was focused on the polyimide a crater was formed, leaving a deposit of conducting carbon.

Venkatesan et al. in "Ion beam irradiated via-connect through an insulating polymer layer" J. Appl. Phys. 55(4), 15 Feb., 1984, pp. 1212–1214 spun a 8000 angstrom thick film of Hunts' Positive Resist HPR-204 onto a silicon substrate coated with a 1000 angstrom layer of silver. The film was irradiated by a 2-MeV Ar+ argon ion beam through a molybdenum mask. Squares of metallization were evaporated on one column of dots. They observed an approximate 50% decrease in film thickness and stated that this was consistent with loss of some of the constituent elements, particularly oxygen and hydrogen. They stated that a similar process could also be attempted by putting a metal layer on the organic film and then irradiating the polymer through the top metallization layer. Further, they warned "However, a polymer that does not undergo substantial thickness change upon irradiation would be necessary to preserve the homogeneity of the upper metal layer." Hitherto, this problem has apparently remained unsolved. In Raffel et al. "A Wafer-Scale Digital Integrator Using Restructurable VLSI" IEEE Trans. Electron Devices, Vol. ED-32, No. 2, Febuary 1985, pp. 479–486, a low power argon laser formed a vertical weld between two normally insulated metal layers. A link structure had a three-layer sandwich of first-level metal, link dielectric, and second-level metal. The dielectric was composed of 8000 Angstroms of amorphous silicon with 100 Angstrom protective barriers of SiO2 interposed between the silicon and metal layers. The laser pulse incident on top-level metal caused the AlSiCu alloy to melt, and a crater was formed as the metal flowed, exposing the amorphous silicon which then melted causing a mixing of melted aluminum and silicon. First-level metal then melted and a metallic aluminum-silicon alloy conducting path was created between first and second level metal, on the order of one ohm or less.

In the same Raffel et al. 1985 article, polyimide was also used as an intermetal insulator. The article explained that there were both advantages and disadvantages to using polyimide. In patterning the polyimide, holes were formed for normal vias between first- and second-level metal, and additional holes were patterned at each link site so that at these locations only the link insulator sandwich separated the two levels of metal. The article also stated that it was necessary to provide windows in the polyimide for both first- and second-level metal cutting because exposure to a laser beam caused charring of polyimide. In the absence of a window, this left a conducting carbon residue typically providing a leakage path of a few thousand ohms across the cut in the conductor.

Due to the widespread applications of IC (integrated circuit) chips, improvement is desirable in their manufacture to provide even further alternative structures and processes, to further increase reliability and yields and to reduce costs.

IC chips are usually mounted on printed circuit boards. U.S. Pat. Nos. 4,853,277 and 4,702,792 describe a process for producing circuit boards. Printed circuit boards are widely used in electronic systems and often have IC chips mounted to them. Innovations in printed circuit board technology are also desirable to even further increase their usefulness and potential for accommodating high density electronic circuitry.

SUMMARY OF THE INVENTION

Generally, one form of the invention is an integrated circuit including conductive elements and a radiation sensitive material interposed between the conductive elements and dosed to different conductivities in different portions thereof.

In general, another form of the invention is a process of integrated circuit fabrication including steps of depositing a radiation sensitive material as a layer and variably dosing it with radiation to establish areas of higher and lower resistivity in the layer.

Generally, a further form of the invention is a printed wiring board including radiation sensitive material and the board further having a conductor layer affixed to the base.

In a yet further form of the invention, a digital computer has a data input device, a central processing unit and a display device. The central processing unit includes an integrated circuit having conductive elements and a radiation sensitive material interposed between the conductive elements and dosed to have different conductivities in different portions thereof.

In general, an additional form of the invention is a transistor having a radiation sensitive material dosed to have two conductive regions separated by a gap of a lower conductivity in the radiation sensitive material, and a conductive substance deposited over the gap.

A still further form of the invention is a smart power device having a microcontroller, a power switching device activated by a signal from the microcontroller, and an electrical resistance body of radiatively dosed radiation sensitive material electrically connected to the power switching device.

A further additional form of the invention is a data processing system including a printed wiring board having integrated circuit chips connected thereto, at least a first of the integrated circuit chips including a radiation sensitive material dosed to have different conductivities in different portions thereof.

In general, another further form of the invention is a digital computer including a data input device, a central processing unit and a display device. The central processing unit includes an integrated circuit having interconnected transistors a plurality of which include a radiation sensitive material dosed to have two conductive regions separated by a gap of a lower conductivity in the radiation sensitive material, and a conductive substance deposited over the gap.

One technical advantage of the invention is that it simplifies manufacture of integrated circuits in some embodiments. The planarization problem is reduced or eliminated. Vias are unnecessary if it is desired to eliminate them. New flexibility in design is conferred. Printed circuit boards can have radiatively introduced interconnects and even electronic elements embedded therein. Other advantages are described or are apparent from the present description.

BRIEF DESCRIPTION OF THE DRAWINGS

FIG. 41 is a microscopic cross-section of interconnected field-effect transistors in an integrated circuit;

FIG. 42 is a microscopic plan view of selected regions of irradiation in a process of making the structure of FIG. 41;

FIG. 43 is a microscopic cross-section of interconnected field effect transistors in another type of integrated circuit;

FIG. 44 is a microscopic plan view of selected regions of irradiation in a process of making the structure of FIG. 43.

Corresponding symbols in the various figures of the drawing identify corresponding structures unless the context indicates otherwise.

DETAILED DESCRIPTION OF PREFERRED EMBODIMENTS

Figure 1:
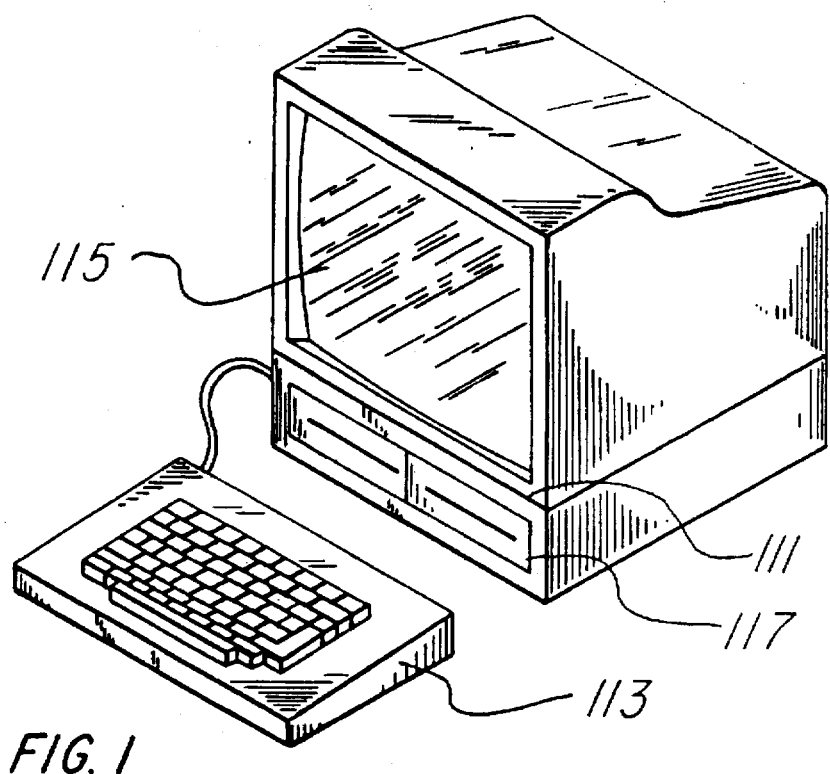
FIG. 1 is a pictorial view of a desk-top computer system.

In FIG. 1 a desk top computer 111 has a keyboard 113 and computer circuitry connected to a display device such as a video monitor 115. Floppy disk drives 117 are accessible from the front of computer 111.

Figure 2:
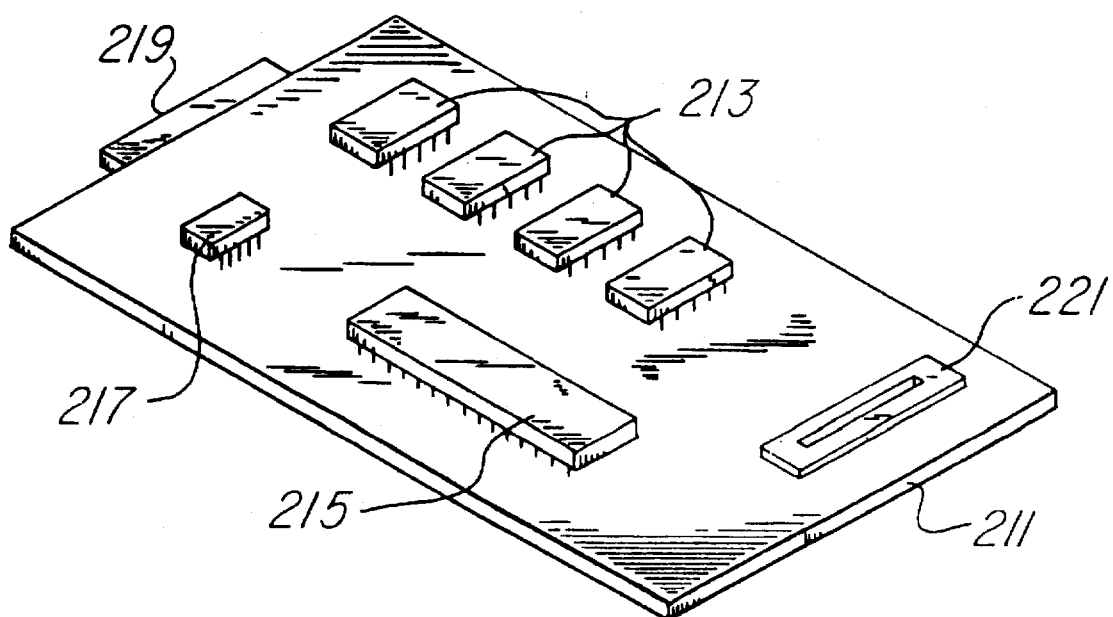
FIG. 2 is a pictorial view of a microcomputer system on a printed wiring board.

In FIG. 2 computer circuitry for computer 111 includes a printed wiring board 211 on which memory chips 213, a microcomputer chip 215, ASIC (application specific integrated circuit) 217, card connector 219 and insertion connector 221 are interconnected and mounted. High density of chips on board 211 (only a few chips shown for clarity) is provided by close packing of the chips. The chips are suitably affixed by projecting pins or by surface mounting, depending on the type of chip package.

Figure 3:
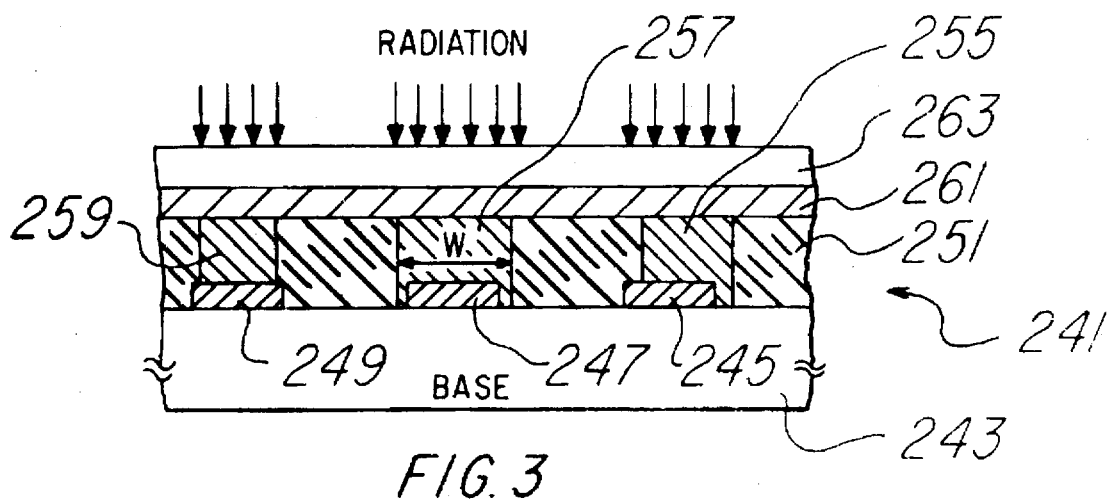
FIG. 3 is a cross-section of part of the printed wiring board of FIG. 2.

In FIG. 3 a printed wiring board, or printed circuit board, 241 has a phenolic or epoxy PC board base 243 with a first layer of electrical conductors 245, 247, 249 patterned thereon. A radiation sensitive film, such as polyimide polymer, 251 is spun on or otherwise appropriately applied over the conductors 245, 247 and 249. Soft x-rays or ultraviolet radiation 255 are used to selectively irradiate the initially insulative film 251 in a pattern of conductive regions 255, 257, 259. A second layer of metal conductor 261 is applied and patterned so that the two layers of electrical conductors are interconnected at particular points to implement any particular circuit design that the skilled worker constructs. Integrated circuits of FIG. 2 (not shown in FIG. 3) are soldered or otherwise electrically connected to the board 241. A protective film 263 overlies second layer 261. Any width dimension w of interconnect which suffices to establish a reliable connection is suitable. It is contemplated that a width w lying in a range between 0.5 and 1.5 times the width of at least one conductor to which connection is to be established is generally satisfactory, and that often a width w equal to the width of at least one of the conductors such as 247 will be optimal.

Figure 4:
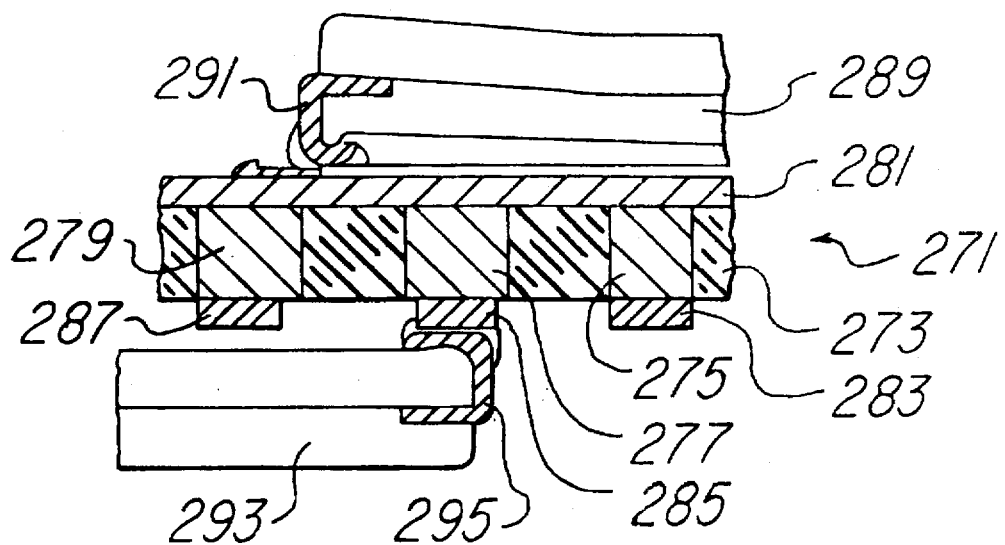
FIG. 4 is a cross-section of a densely packed printed wiring board with chips on both sides and electronic connections and devices internal to the printed wiring board.

In FIG. 4 an alternative printed circuit board 271 has the printed circuit board base material 273 be radiation sensitive and mechanically supportive. On one side of base 273 a layer of conductors such as 281 are laid down. On the opposite side of base 273 another layer of conductors 283, 285, 287 are provided. Either before or after the conductors are provided, soft x-rays or ultraviolet radiation are applied to appropriate regions 275, 277, 279 to form electrical connections and resistors and diodes between the conductors where desired. These through-connections advantageously eliminate drilling of through holes, eliminate mounting of some or all discrete components, increase board economy and reliability and provide a technological alternative in printed wiring board design.

A J-leaded surface mount integrated circuit chip 289 of incorporated application Ser. No. 455,210 now U.S. Pat. No. 5,313,102 has a terminal 291 which is soldered to conductor 281. Another integrated circuit chip 293 on the opposite side of board 271 has another terminal 295 soldered to conductor 285. In this way, high density printed circuit board construction utilizes both sides of the board 271 and even much of the base 273. A protective coating is optionally applied to the surfaces of the entire assembly.

Figure 5:
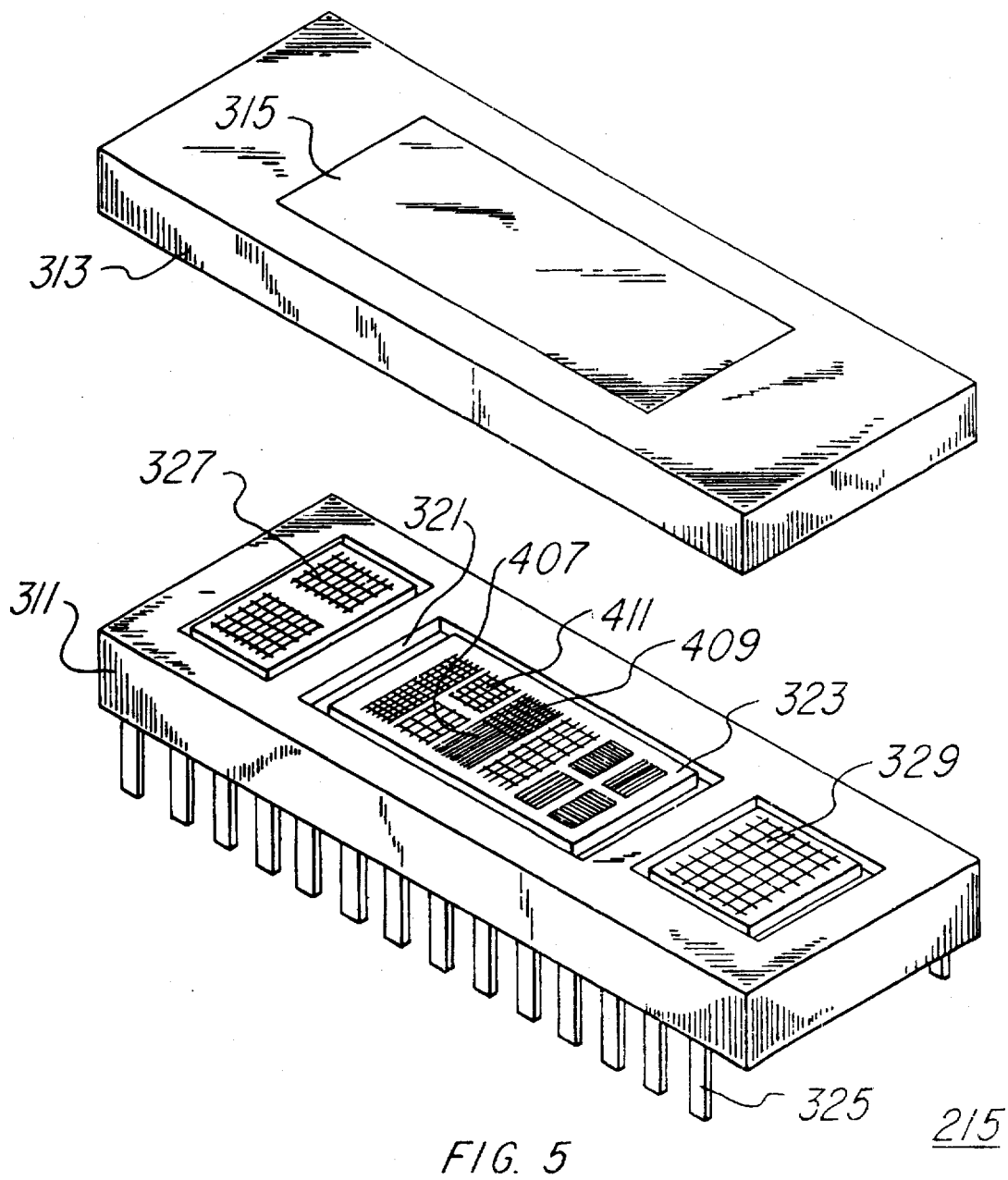
FIG. 5 is an exploded pictorial of a multi-chip integrated circuit.

In FIG. 5 a microcomputer chip 215 is pictorially illustrated, and has a multichip package including a base 311 and a cover 313 with EPROM erase window 315. A recess 321 holds a CPU central processing unit integrated circuit die 323 having many circuit elements fabricated thereon, including a ROM (read only memory) portion 411, a RAM 409 and a CPU 407. Die 323 is electrically connected at bond pads on the die 323 to package pins 325. Peripheral IC dies 327 and 329 are electrically connected similarly to die 323. The electrical connections to the pins and between chips 327, 323 and 329 are provided by conductors embedded in the base 311. In some embodiments, the package 311 itself has a sophisticated interconnection structure produced by selective irradiation of a radiation sensitive material comprised in the package, which FIG. 3 illustrates analogously. The use of selectively irradiated radiation sensitive material is also well suited to single chip packages.

Figure 6:
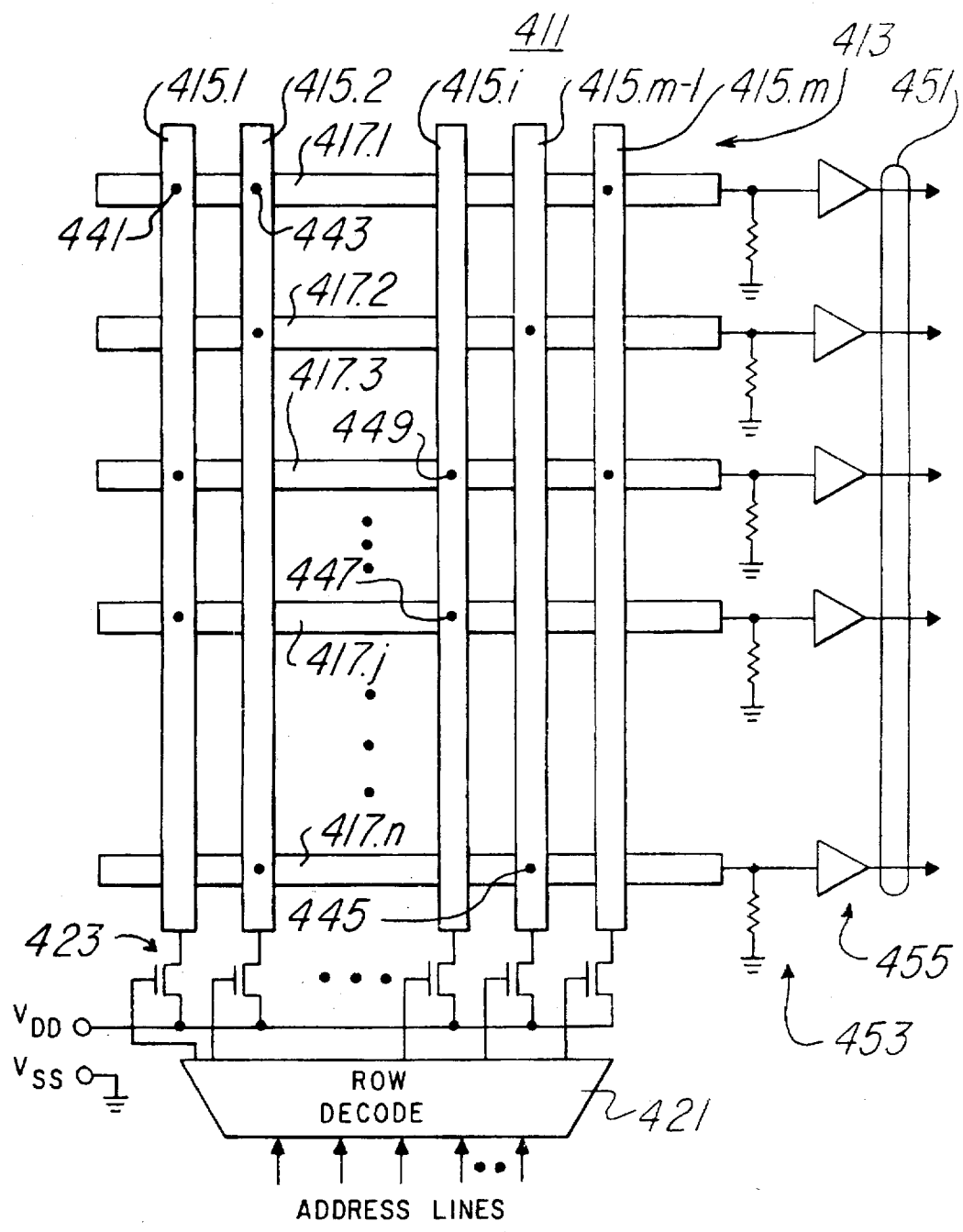
FIG. 6 is a microscopic plan view of a ROM integrated circuit on the die of FIG. 5, shown partially in electrical schematic form.

In FIG. 6 ROM circuit 411 has a lattice 413 including a set of parallel row conductors 415.1, .2, . . . i, . . . m-1, .m. A perpendicular set of parallel column conductors 417.1, .2, .3, . . . j, . . . n are displaced by an interlayer substance in the plane of the figure so that without more, there is no electrical connection between the row and column conductors 415 and 417.

Chip 323 also advantageously incorporates electrical interconnections, resistors, diodes, transistors and any other electrical elements made by selective irradiation of radiation sensitive material such as a polyimide as interlayer substance in chip 323.

For example, in FIG. 6, address lines for the ROM circuit 411 of chip 323 enter a row decode circuit 421. The bits of an address are decoded by the row decode circuit 421 and activate the gate of one of a number of transistors 423 to select a particular one of row conductors 415 by energizing it with voltage from a supply pin VDD.

Intermetal connections are provided to establish the bits which are stored in the ROM 411. The use of polysilicon as a row or column conductor is also contemplated, and the use of selective irradiation to establish interconnects between polysilicon and other nonmetal conductors (including irradiated polyimide for example) is equally described in this discussion of intermetal connections. The intermetal connections are illustrated in FIG. 6 as dots, some of which are numbered as 441, 443, 445 and 447. As shown, intermetal connection 441 connects a row conductor 415.1 and a column conductor 417.1. Connection 443 connects conductors 415.2 and 417.1. Connection 445 connects conductors 415.m-1 and 417.n. Connection 447 connects conductors 415.i and 417.j. Connection 449 connects conductors 415.i and 417.3. A set of buffers 455 respectively connected to the lines 417 provide outputs for the bits of each data word retrieved from ROM 411. A set of pull down resistances 453 hold the conductors 417 low unless voltage VDD is supplied to them through a transistor 423 and one of the interconnections like 447. Pull down resistances 453 are connected to a return common to a pin VSS.

Figure 7:
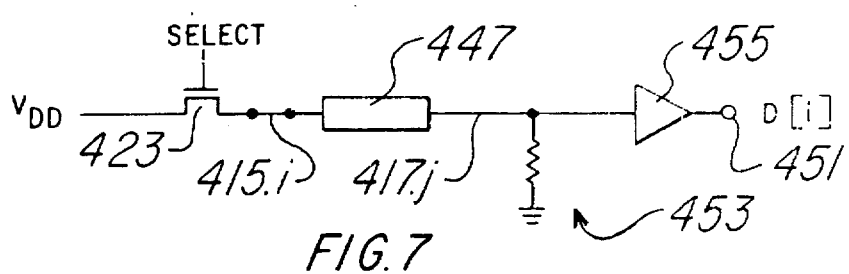
FIG. 7 is an electrical schematic diagram illustrating an electrical circuit in the ROM integrated circuit of FIG. 6.

In FIG. 7 the electrical operation of ROM 411 utilizes conductor 415.i coupled to voltage source pin VDD by a particular transistor 423 selected by a select signal from decoder 421. Intermetal connection 447 is a programmable resistance and series rectifier established between a metal1 layer for the column conductors 417 and a metal2 layer for the row conductors 415 at each selected point where an interconnect is desired. The resistance of intermetal connection 447 and a shunt resistance 453 for line 417.j form a voltage divider, the output of which feeds a data pin D[i] by buffer 455 in the set of outputs 451.

Figure 8:
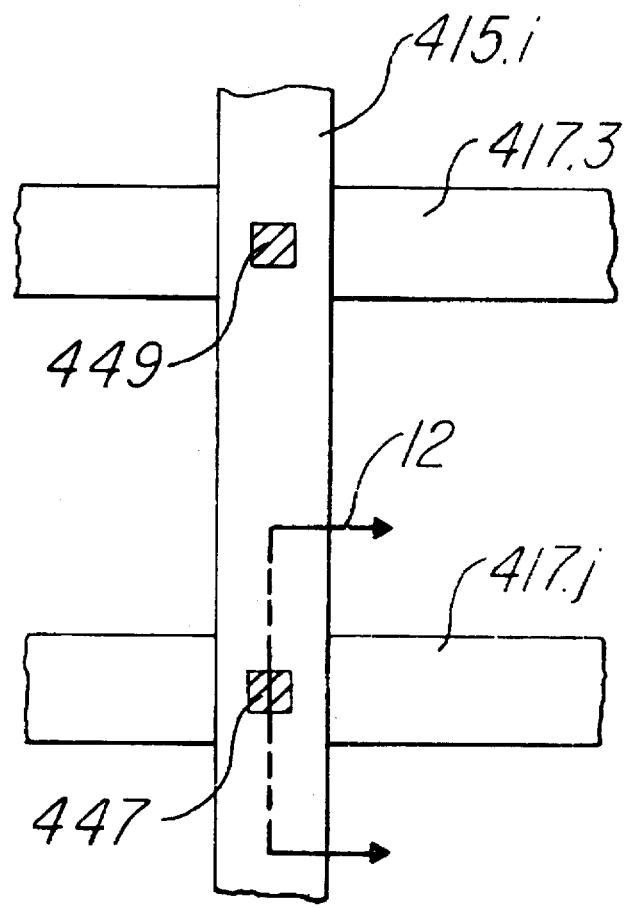
FIG. 8 is a magnified plan view of an interconnection between conductors of FIG. 6.

FIG. 8 shows a detail of lines 417.3 and 417.j passing beneath line 415.i. Interconnects 447 and 449 are shown cross-hatched.

Figure 9:
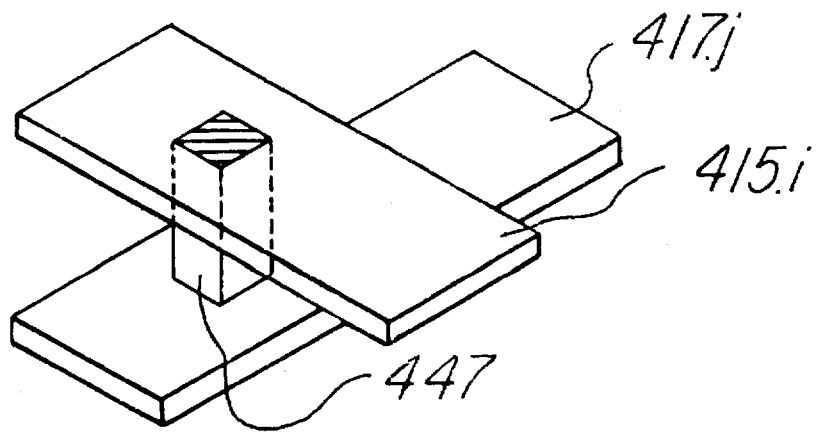
FIG. 9 is a perspective view of an interconnection of FIG. 8.

In FIG. 9 intermetal connection 447 in perspective view is seen as a solid block of resistive material connecting conductor 415.i and conductor 417.j.

Figure 10:
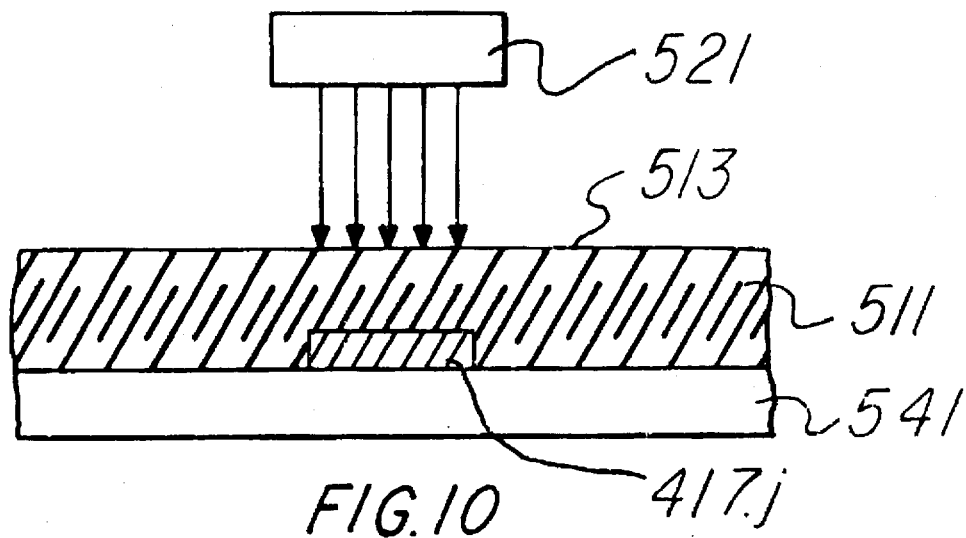
FIG. 10 is a cross-section of an integrated circuit showing an selective irradiation step in fabricating the interconnection of FIG. 9.

In FIG. 10, a cross-sectional detail of FIG. 8 shows a spin-on polymer 511 such as polyimide deposited as an intermetal film or interlayer substance over conductor 417.j on a substrate 541. The polymer 511 has a smooth, substantially planar top surface 513 for subsequent deposition of conductor 415.i of FIGS. 6–9 and 12.

In FIG. 10, the polymer film 511 is exposed to soft x-ray or UV laser radiation from a radiation source 521 to induce a chemical change in the polymer and lower the electrical resistance of selected areas. Using an excimer laser or an x-ray system including source 521, for example, no additional processing is required to create interconnects. Additionally, the surface for metal2 deposition is planar, even at the interconnect points. In this way, polymer films are provided in a ROM structure in a semiconductor integrated circuit structure as shown in FIGS. 6, 8 and 10.

Figure 11:
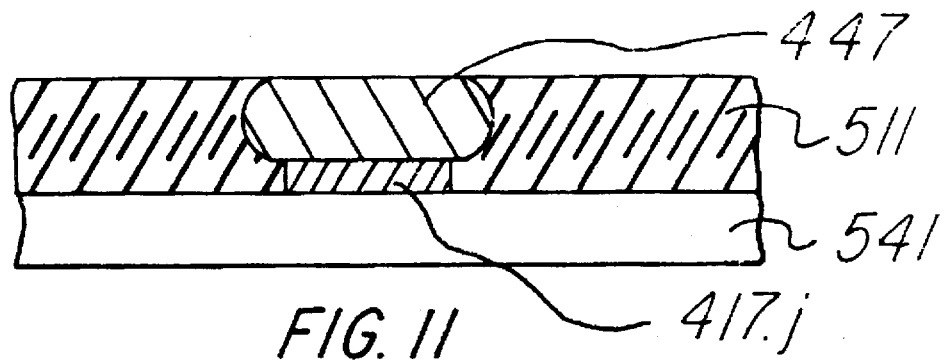
FIG. 11 is a cross-section showing an area of changed resistivity resulting from the irradiation of FIG. 10.

In FIG. 11 intermetal connect 447 results from the process shown in FIG. 10.

Figure 12:
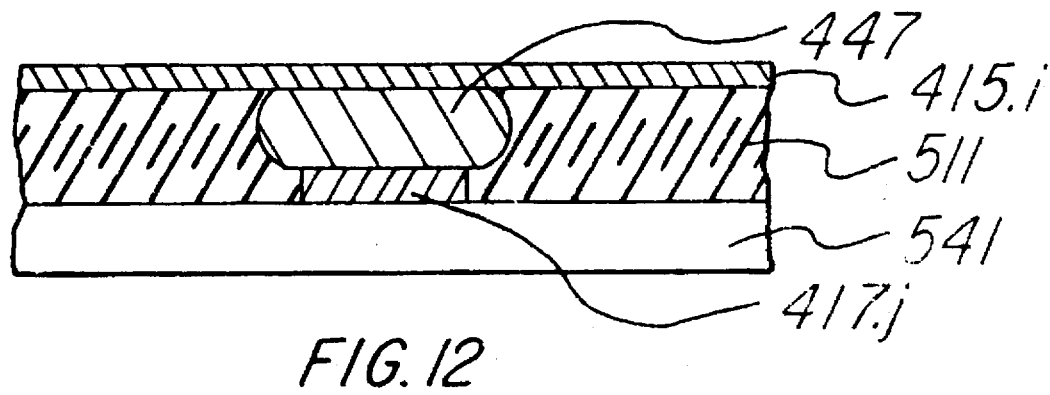
FIG. 12 is a cross-section showing a completed interconnection of two conductors.
Figure 13:
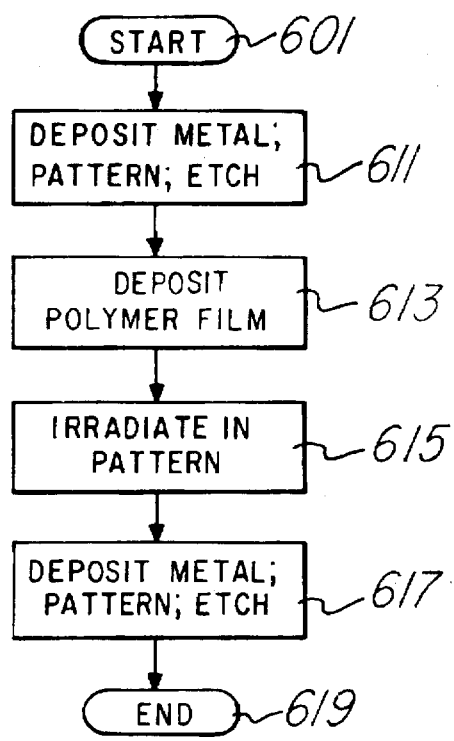
FIG. 13 is a flow diagram of a process of making the structure of FIG. 12.

FIG. 12 is a cross-section of FIG. 8 along cut line 12, and FIG. 13 summarizes the process of making the structure of FIG. 12. In FIG. 13, operations commence with START 601 and proceed to a step 611 wherein metal1 for conductors 417 is deposited on substrate 541, patterned and etched. Metal1 and metal2 designations are used as shorthand designations for first and second metalization layers herein. Then in a step 613, polyimide polymer film 511 is deposited, such as by a spin-on process, followed by step 615 wherein the polymer film 511 is irradiated in the desired pattern. Next in a step 617, metal2 is deposited on the film 511, as shown in FIG. 12. Patterning and etching of metal2 complete step 617 whereupon END 619 is reached.

As thus described, operations proceed until the intermetal connect 447 of FIG. 11 is produced according to operations 611, 613, 615 in the flow diagram of FIG. 13. In FIG. 11 substrate 541 bears conductor 417.j on which polymer film 511 is deposited in step 613. Before metal2 deposition, irradiation from source 521 occurs in step 615, producing interconnect 447 in film 511 as shown in FIG. 11. Then in step 617 of FIG. 13 and in the cross-section of FIG. 12, metal2 deposition lays down conductors including conductor 415.i.

Figure 14:
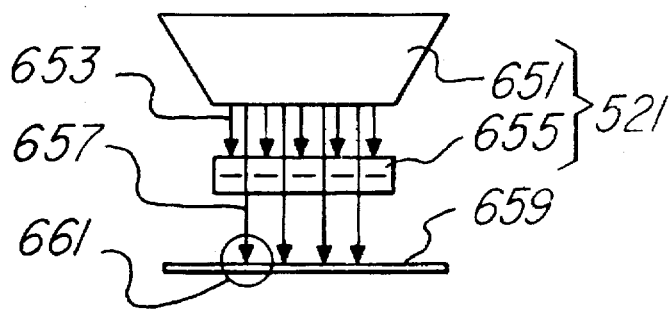
FIG. 14 is a front elevation of radiation apparatus and a workpiece.
Figure 30:
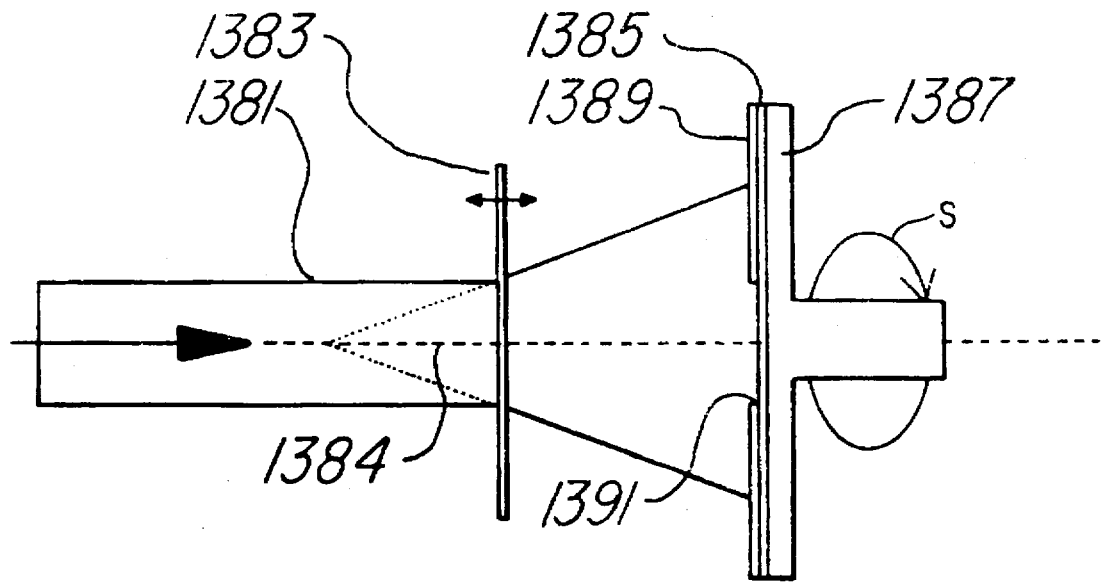
FIG. 30 is a cross-section of an ultraviolet laser irradiating apparatus used to demonstrate conductivity changes in radiation sensitive material over many orders of magnitude.

In FIG. 14 source 521 includes a radiation emitting device 651 which produces radiation 653 that impinges on a radiation mask 655. Mask 655 has a pattern of absorptive (or reflective) nontransmissive areas as well as transmissive areas which admit or pass radiation 657 to a wafer, printed circuit board, or other workpiece 659. In a first example, the device 651 is a deep UV (ultraviolet) emitter. Mask 655 has a quartz substrate with chrome laid down thereon. In a second example, the device 651 is a soft x-ray source, see "X-ray lithography" by A. Heuberger, J. Vac. Sci. Technol., B 6(1) January/February 1988 pp. 107–121 and "Nondestructive single shot soft x-ray lithography and contact microscopy using a laser-produced plasma source", by R. J. Fosser et al., Applied Optics, Vol. 26, No 19, 1 Oct., 1987, pp. 4313–4318. Mask 655 has a boron substrate with silicon masking substance thereon for example. In a third example discussed in connection with FIG. 30, a projection system including a deep UV excimer laser with diverging lens irradiates the workpiece. Combining elements of these examples is also contemplated.

Figure 14A:
FIG. 14A is a plan view of the workpiece of FIG. 14 showing the workpiece rotating to uniformly lay down the radiation sensitive material.

In FIG. 14A a preceding step of preparing the layer of polymer rotates the workpiece 659 around a center of rotation 660 while the polymer is cross-linking or curing to a smooth film. This process, called spin coating deposition, or spin-on polymer preparation, is in one process accomplished by spreading or applying a predetermined amount of polymer in solvent fluid to the workpiece 659. The solvent evaporates and the polymer cross-links or cures. Heating or cooling the workpiece and adjusting the speed of rotation can drive off the solvent at a faster or slower rate. When the polymer is reasonably smooth and stable mechanically, the workpiece is heated to dry the polymer layer. A mathematical analysis of a spinning process is found in Polymers for High Technology, Chapter 22, "Polymer Processing to Thin Films for Microelectronic Applications" by S. A. Jenekhe, 1987, pp. 261–269.

Many polymers are applicable for the present purposes. Linear all-aromatic polyimides are one example. Solubility is increased by using alternatives of polyimides that have 1) aromatic pendant groups on the polymer backbone, or 2) varying isomeric points of attachment of bridging groups in diamine monomers of the polymer, or 3) using —CF3 and/or —SO2 groups. Polyimides can also be prepared with biphenyltetracarboxylic dianhydrides in a solvent of N-methylpyrrolidone.

In a first example of polymer synthesis, the following steps are performed:

A1. Recrystallize 3,3'-oxydianiline diamine (3,3'-ODA) from chloroform/hexane (melting point 74 degrees C.).

A2. Recrystallize 2,2-bis (3,4-dicarboxphenyl) hexafluoropropane dianhydride (6 F) from toluene/acetic anhydride (melting point 241 degrees C.).

B. Vacuum distill dimethylacetamide (DMAc) solvent from calcium hydride at 107 degrees C.

C. Flush a flask with dry nitrogen.

D. Add 3,3'-ODA from step A1 and DMAc to the flask.

E. Add an equimolar amount of solid 6 F dianhydride (from step A2) to the dissolved diamine of step D. Weight ratio of solids is 15%.

F. Stir for 8–24 hours at room temperature to produce polyamic acid solution. Refrigerate to store for further use as amic acid resin.

G. In a dust free chamber at 10% relative humidity, place amic acid resin onto soda-lime glass receptacle.

H. Cure in forced air oven for one hour at 300 degrees C. to produce polyimide polymer.

I. Dissolve polyimide polymer from step H in any suitable solvent such as a solvent selected from the group: i. chloroform CHCl3, ii. DMAc, iii. DMF (N,N-dimethylformamide)

J. Spray or otherwise apply dissolved polyimide polymer from step I onto workpiece 659.

K. Rotate workpiece 659 to planarize the polymer in dust free chamber. Adjust time and modest heating to obtain hard, dry polymer film.

In a second example of polymer synthesis, the following steps are performed:

A1. Recrystallize 3,3'-oxydianiline diamine (3,3'-ODA) from chloroform/hexane (melting point 74 degrees C.).

A2. Recrystallize 2,2-bis (3,4-dicarboxphenyl) hexafluoropropane dianhydride (6 F) from toluene/acetic anhydride (melting point 241 degrees C.).

B. Vacuum distill dimethylacetamide (DMAc) solvent from calcium hydride at 107 degrees C.

C. Flush a flask with dry nitrogen.

D. Add 3,3'-ODA from step A1 and DMAc to the flask.

E. Add an equimolar amount of solid 6 F dianhydride (from step A2) to the dissolved diamine of step D. Weight ratio of solids is 15%.

F. Stir for 8–24 hours at room temperature to produce polyamic acid solution.

G. In a dust free chamber at 10% relative humidity, apply polyamic acid solution onto workpiece 659. Spin workpiece 659 to obtain uniform layer.

H. Cure in forced air oven for one hour at 300 degrees C. to produce polyimide polymer layer. Adjust time and temperature for satisfactory product as hard dry polymer film.

The second example has fewer steps and applies polyamic acid solution directly to the workpiece. The first example avoids substantial temperature elevation of the workpiece in polyimide preparation by applying dissolved polyimide to the workpiece after the polyimide is synthesized.

Some information on polyimide preparation and solubility is detailed in Polymers for High Technology, chapter 37 "Soluble Aromatic Polyimides for Film and Coating Applications" (chapter 37 not subject to U.S. copyright), 1987, pp. 437–444.

A third example of preparation involves steps of dissolving and then applying a commercially available polyimide product such as polyimide PI-2545 or PI-2555 from DuPont, or PIX 3400 of the PIQ series from Hitachi Chemicals. DuPont has products designated Pyralin(Registered trademark) including LX, PD, SP and LTP families. According to DuPont literature, a Pyralin(R) LX family of polyimide coatings including PI-2610D and PI-2611D match the thermal expansion of coefficient of silicon and alumina substrates. The chemistry is disclosed in DuPont expired U.S. Pat. Nos. 3,179,614 and 3,179,634 to W. E. Edwards, and the composition is BPDA/PPD (biphenyldianhydride/ 1,4 phenylenediamine). The dielectric constant is 2.9.

The polyimide is applied by spin-on, spray coating, die dispensing, roller coating, or screening, as described in Polymers for High Technology, chapter 40 "Polyimides as Interlayer Dielectrics" 1987, pp. 466–483. Spin-on produces layers on the order of microns in thickness. Solvent dilution and spin-on parameters are adjusted as indicated by microscopic examination of test samples to optimize the deposition process. DuPont published technical data for PI-2610D and PI-2611D polyimides disclose a spin-on process. For PI-2611D, a wafer spin speed between 2000–5000 rpm (revolutions per minute) for 30 seconds produces a film thickness between 8 and 4 microns respectively. Prebake occurs on a hot plate at 140 degrees Celsius for 3 minutes followed by cure at 350 degrees Celsius for 30 minutes in dry nitrogen. Under similar conditions PI-2610D produces a film between 3 microns and 1 micron thick depending on spin speed as above. Higher speeds can be used to obtain even thinner films. The cured substances also available from the manufacturer under the trademark Kapton (R).

Adequate safety procedures should be employed in accordance with good chemical practice in the art in using the chemicals described herein.

A fourth example of preparation to obtain submicron films on the order of a tenth micron uses Langmuir-Blodgett technique as described in Polymers for High Technology, chapter 40 "Preparation of Polyimide Mono- and Multilayer Films" 1987, pp. 484–495. The process has the following steps:

A. Synthesize polyamic acid in DMAc from tetracarboxylic dianhydride and diamine or other suitable constituents.

B. Prepare solution of the polyamic acid to 1 millimole per liter in a one-to-one mixture of DMAc and benzene. Add dimethylhexadecylamine (DMC16) to the same 1 millimole concentration in said solution mixture. This produces polyamic acid salt.

C. Spread the polyamic acid salt solution on deionized water.

D. Deposit the polyamic acid salt on a substrate by moving the substrate in a vertical orientation first down and then up through the air-water interface at a rate of 3–5 millimeters per minute at 20 degrees C. and allow to dry.

In a fifth example an alternative to polyimides is prepared. Diethynyl monomers such as diethynylbiphenyl, diethynylterphenyl and diethynyldiphenylether are cyclotrimerized with equimolar amounts of phenylacetylene to yield polymers. See Polymers for High Technology, chapter 38 "Cocyclotrimerization of Aryl Acetylenes: Substituent Effects on Reaction Rate" 1987 pp. 445–456.

A review of deposition of metals such as tungsten and aluminum where these are used in IC fabrication is found in "Low Pressure Chemical Vapor Deposition of Tungsten and Aluminum for VLSI Applications" by R. A. Levy et al., J. Electrochem. Soc., Vol. 134, No. 2, February 1987 pp. 37C–49C. The LPCVD process is also used to deposit polycrystalline silicon and insulators such as oxides and nitrides. A VLSI chip is suitably provided with multiple layers of metalization or polysilicon. The metal or polysilicon layers are separated by insulators which can be CVD (chemical vapor deposition) oxides. Metals are also suitably deposited by sputtering.

The herein-described use of selectively irradiated radiation sensitive material obviates a major problem of oxide intermetal films—planarization or smoothing of the top surface to allow better deposition and definition of the subsequent metalization. Resist-etchback and spin-on-glass are techniques used to solve this problem, but both require additional processing. Once the intermetal film is planar, vertical holes called vias have been cut to allow connection between metal layers. The process for cutting vias involves deposition of photoresist, patterning, and etching of the film. Metal deposition into the vias has been a problem, with less than 50% step coverage. The present work provides via-less interconnects, entirely eliminating vias when this is desired. In other cases, via technology is practiced and combined on the same chip with conductive elements of irradiated radiation sensitive material.

Figure 15:
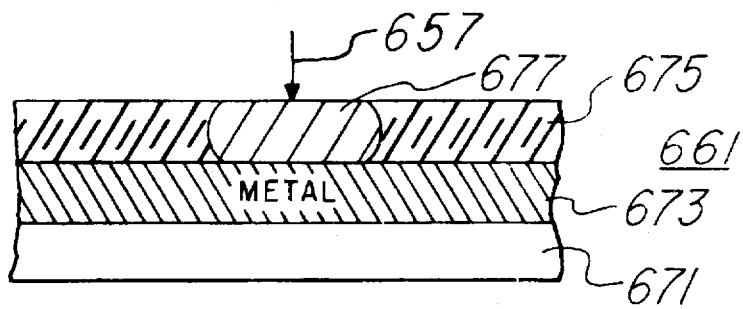
FIG. 15 is a front cross-section of a microscopic portion of the workpiece of FIG. 14.
Figure 16:
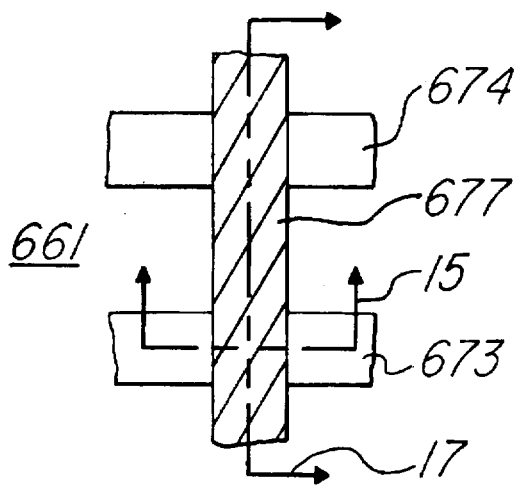
FIG. 16 is a microscopic plan view of the portion of the workpiece of FIG. 14.
Figure 17:
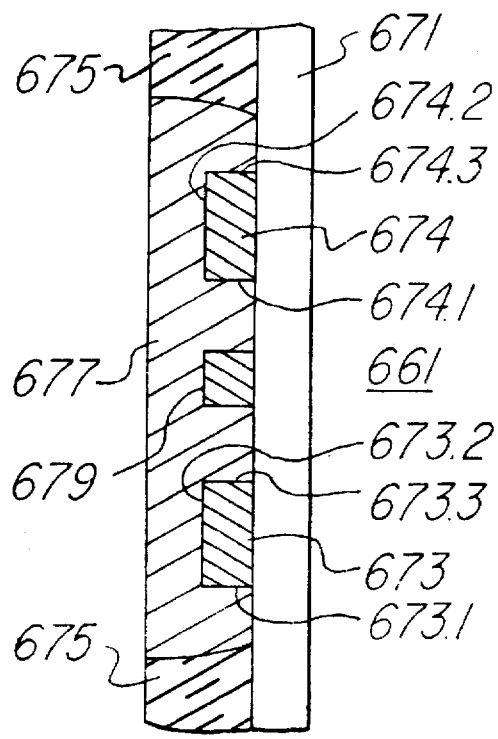
FIG. 17 is a profile cross-section of the portion of the workpiece of FIG. 14.

A portion 661 of workpiece 659 is shown greatly magnified in FIGS. 15, 16 and 17. In the front cross-section of FIG. 15, portion 661 has a first layer 671 overlain with a metal layer 673 that has a radiation sensitive material 675 on top. Radiation 657 alters the conductivity of material 675 according to the pattern established by mask 655 and produces a resistive or conductive section 677 in the material 675.

It is to be understood that in some embodiments the material 675 is selected to be of a type wherein radiation renders the material more conductive, and in other embodiments the material 675 is some other materials selection wherein radiation renders the material less conductive than the initial laid-down layer. In one example, polyimide is an insulator that is programmed in conductivity according to the radiation dose differentially supplied to different areas thereof.

Depending on the nature of the workpiece, layer 671 is silicon dioxide (SiO2), or can be the substrate of an integrated circuit, or can be the material of the base of a printed circuit board, or any other layer of a suitable workpiece for the process.

In the plan view of FIG. 16 portion 661 has metal conductor 673 associated with a parallel metal conductor 674 in the same metal level. Section 677 is illustrated as a rectangular region of programmable conductivity or resistivity overlying and touching both conductors 673 and 674, and extending beyond both of the conductors to any extent desired. The shape of region 677 is alternatively oval, circular, polygonal or any other shape suited to the purposes of a particular application.

In the profile cross-section of FIG. 17, section 677 surrounds conductors 673 and 674 on three surfaces suffixed .1, .2 and .3 of each of them. The irradiated polymer section 677 is electrically isolated, surrounded and protected by undosed polymer of film 675, thereby confining the programmable conductivity to access by conductors 673 and 674. In some embodiments section 677 extends to one or more other conductors such as a conductor 679.

Figure 18:
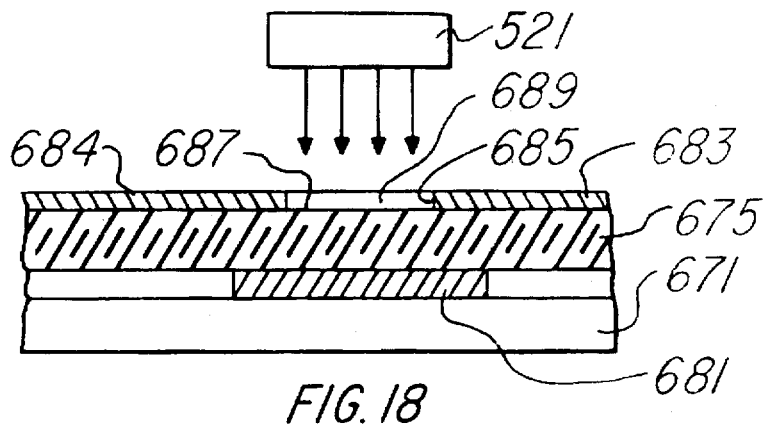
FIG. 18 is a cross-section of a structure produced by a process of creating interconnects after a top layer of metal is deposited.
Figure 19:
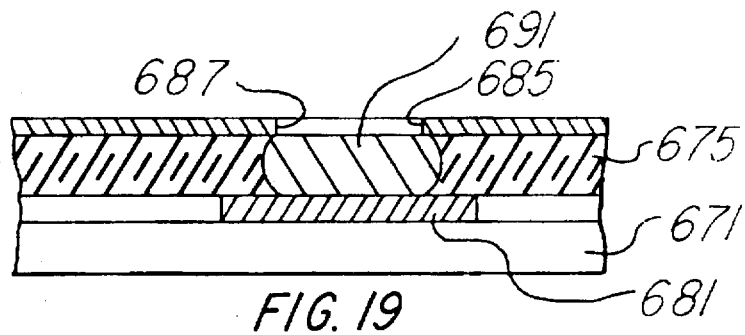
FIG. 19 is a cross-section of the selectively irradiated structure of FIG. 18.

In FIG. 18, first layer 671 has a conductor 681 thereon. Radiation sensitive material, such as a polymer film, 675 is applied, followed by another conductor layer having conductors 683 and 684 opposed at ends 685 and 687 respectively. In this way a gap or aperture in the conductor layer remains. The polymer film 675 is exposed to ultraviolet or soft X-ray radiation from a radiation source 521 through an aperture 689 in the conductor to induce a chemical change in the polymers and lower the electrical resistance of the exposed areas such as region 691 of FIG. 19. In FIG. 19 intermetal connect 691 results from the process shown in FIGS. 18 and 20.

Figure 20:
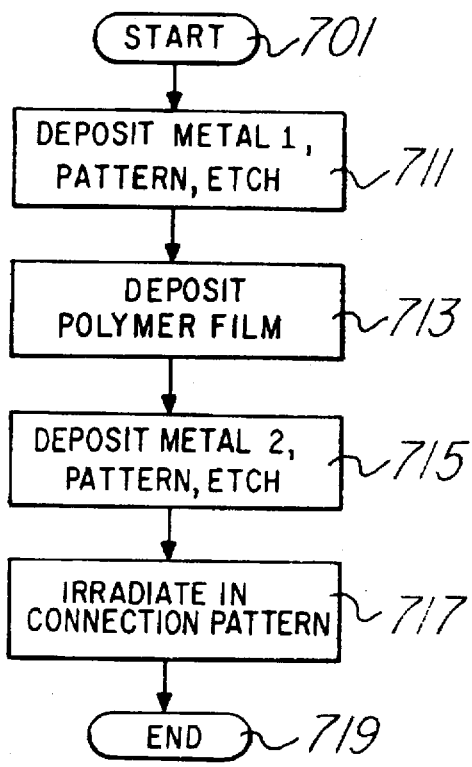
FIG. 20 is a flow diagram of a process of producing the structure of FIG. 19.

FIG. 20 summarizes the process of making the structure of FIG. 19. Operations commence with START 701 and proceed to a step 711 wherein metal1 for conductor 681 is deposited on layer 671, patterned and etched. Then in a step 713, polyimide polymer film 675 is deposited, followed by step 715 wherein metal2 is deposited on the film 675, and the metal is patterned and etched. Then in a step 717 source 521 radiates a pattern of different conductivity into the workpiece, producing the interconnect 691 and the other interconnects for the entire workpiece in the same operation, whence END 719 is reached.

Figure 21:
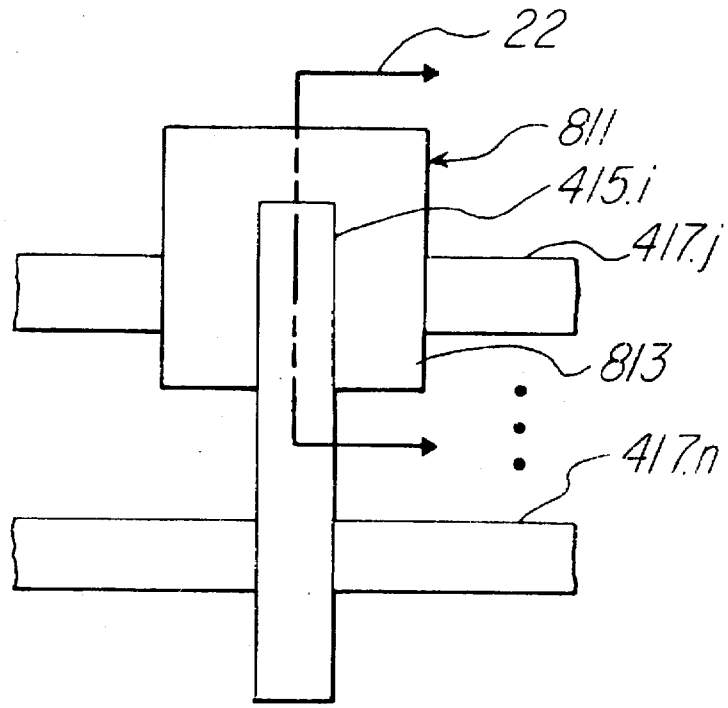
FIG. 21 is a plan view of conductors which are selectively irradiated in a region wider than the conductors.

A modified process in FIG. 21 lays down metal1, polymer 511 and then metal2. Numbering is analogous to FIG. 6. However, in FIG. 21, radiation is applied over a region 811 that exceeds the width of both the conductor 417.j and conductor 415.i at the intersection where an interconnect is to be defined. When the radiation is applied before deposition of conductor 415.i, the entire region 811 is uniform in the conductivity newly established for it by the applied radiation dose.

If radiation is applied after the metal2 conductor 415.i is made, the region 811 will have a conductivity that varies depending on the thickness of conductor 415.i, the amount and type of the radiation, and the geometry of the metal layers generally. For instance, if conductor 415.i entirely blocks the radiation, an area of unchanged resistivity will lie directly beneath conductor 415.i in the region 811, and the rest of region 811 will have altered resistivity.

Figure 22:
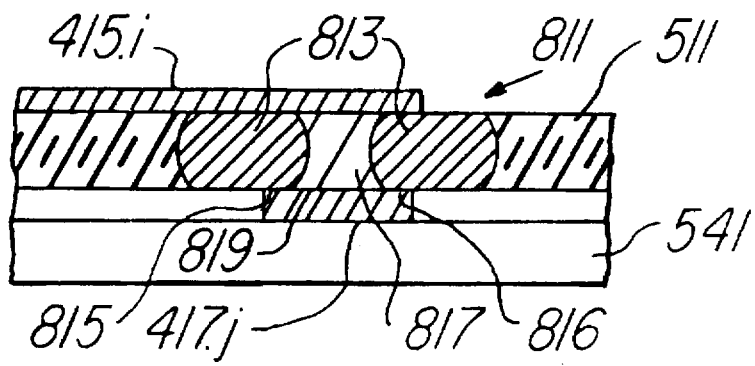
FIG. 22 is a cross-section of conductors and a polymer film which is irradiated over the region of FIG. 21 after the upper conductor is deposited.

When conductor 415.i is thin enough, or when some radiation is able to impinge upon the radiation sensitive material beneath conductor 415.i, two areas 813 and 817 of different conductivity are formed in region 811 as shown in FIG. 22. With polyimide, layer 511 is dielectric when undosed. Area or body 813 is directly exposed to radiation and receives the greater dosage and thus is made the most conductive part of region 811. The body 813 touches conductors 415.i and 417.j laterally, at conductor edges such as 815 and 816. To the extent that the metal of conductor 415.i shields a region 817 of the polymer film 511 from irradiation, the region 817 is less conductive. However, region 817 has a broader zone of contact 819 with conductor 417.j. As a whole the conductivity established in the region 811 advantageously suffices to provide an interconnect or programmable resistance depending on geometry and radiation dosage, even when irradiation occurs after the upper conductor 415.i is laid down.

It is apparent that the interconnection approach has numerous alternative embodiment and process permutations. In a further version shown in FIGS. 23 and 24, interconnects of more than two layers suitably have the operations described above performed in sequences of the same interconnect process or in sequences having different interconnect processes.

Figure 23:
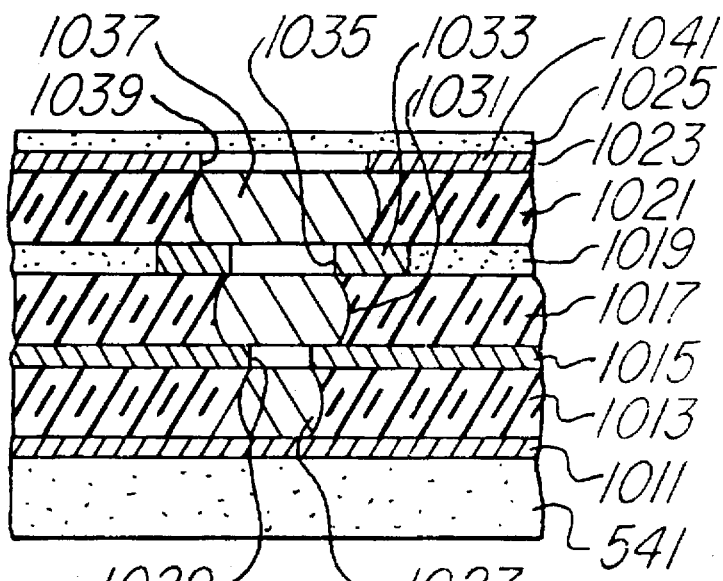
FIG. 23 is a cross-section of a multi-layer structure produced by repeated applications of herein-disclosed processes.

In FIG. 23 substrate 541 has a metal layer 1011 deposited thereon, followed by deposition of polymer layer 1013, gapped metal layer 1015, polymer layer 1017, gapped metal 1019, polymer layer 1021, gapped metal 1023, and protective coating 1025. Irradiation of the assembly from above simultaneously renders conductive a portion 1027 through metal aperture 1029, portion 1031 conductive through metal 1033 aperture 1035, and portion 1037 conductive through aperture 1039. Multilayer interconnects are thus provided in one irradiation process step.

Figure 24:
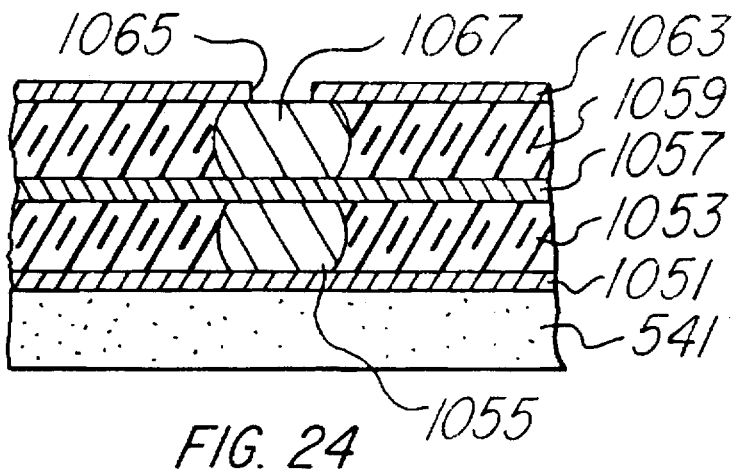
FIG. 24 is a cross-section of another multi-layer structure produced by herein-disclosed processes.

In FIG. 24 substrate 541 has a metal layer 1051 deposited thereon, followed by deposition of a polymer layer 1053, which is then irradiated to produce conductive portion 1055. Next, a conductive layer 1057 is deposited on film 1053 and thereby connected to layer 1051 by portion 1055. In a succeeding process step, polymer layer 1059 is deposited on metal 1057, followed by metal 1063 which is etched to produce gap 1065. Irradiation establishes conductive area 1067 to connect metal 1063 to metal 1057. The irradiation step can either precede or follow the deposition of metal 1063. The penetration depth of the radiation is coordinated with the depth of the polymer layers 1053 and 1054 to produce conductive portions in the polymer that either penetrate the polymer completely as shown or provide isolated circuitry in various regions as appropriate.

Figure 25:
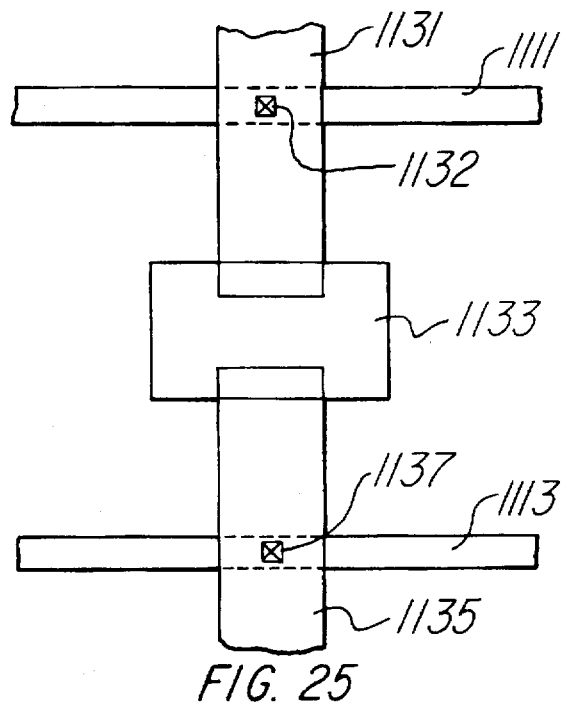
FIG. 25 is a plan view of conductors and a programmable resistor in radiation-sensitive material.

In FIG. 25 metal lines 1111 and 1113 are linked by contact windows 1132 and 1137 to metal2 regions 1131 and 1135 respectively connecting to outlying circuitry (not shown). A gap separates the metal 1131 and 1135. A region of X-ray or UV irradiated polymer 1133 between and beneath the metal regions 1131 and 1135 provides a programmable resistance.

FIG. 25 also depicts an alternative wherein elements 1131 and 1135 are highly dosed polymer and region 1133 is masked to receive a lesser dose establishing the programmable resistance. Then windows 1132 and 1137 can be dispensed with.

Figure 26:
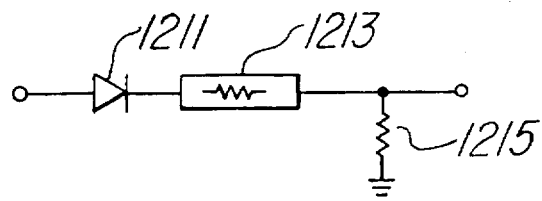
FIG. 26 is an electrical schematic diagram of a diode circuit produced by processing radiation-sensitive material.

FIG. 26 shows the polymer supporting the fabrication of a diode 1211 in series with a programmable resistance 1213. A pull down resistance 1215 is also provided. In a first example, doping establishes conductivity and a rectifying junction in one step. In a second example, radiation partially establishes conductivity, followed by doping to establish a rectifying junction.

In one process embodiment, a doping step dopes the polymer with a fixed density of doping sites. During the manufacturing process of the polymer or a constituent thereof, a dopant species is incorporated into the polymer as an anion to replace a hydrogen bond on the polymer. The polymer is applied to the workpiece as described elsewhere herein. Selective irradiation activates the doping sites with photons creating semiconductive areas and rectifying junctions. Suitable dopants for incorporation in the radiation sensitive material such as polymer include any elements on either side of the periodic table from carbon, such as elements in groups III or V or elements in groups II or VI. Boron, arsenic and phosphorus are exemplary dopants. The dopants are incorporated in the polymer by replacing hydrogen in the polymer units in a molar ratio of between 1 millimole to 1 mole per mole of polymer constituent. Still other examples of dopant species and compounds are halogens or silver halide wherein the halides can be bromine and iodine for instance.

It is also contemplated to fabricate semiconductors with undoped films. The doping sites are made to occur by changing the morphology of the film by the irradiation itself. This provides semiconductive and rectifying behavior at IC thicknesses on the order of a micron. In this way diodes can be made for tiny ROM cells and many other structures are provided.

In an alternative embodiment resistivity of the polymer is varied or modulated over more than 10 orders of magnitude with argon Ar+ dopant doses on the order of 10 to the 15th to 16th power per square centimeter (cm-2), compare M. L. Kaplan et al., Journal of Applied Physics, vol. 55, No. 3, Feb. 1, 1984, p. 732. Hydrogen and neon ions are also suitable.

Figure 27:
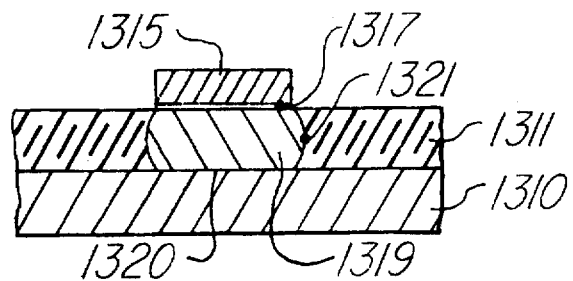
FIG. 27 is a cross-sectional view of a structure having the equivalent circuit of FIG. 26.

In FIG. 27 a metal layer 1310 has polymer 1311 deposited thereon. Next irradiation produces a higher conductivity area 1319. An interface of area 1319 with metal 1310 is ohmic. Then, doping activation of area 1319 by radiation from above by any of the herein described doping methods produces a doped surface 1317. A metal conductor 1315 is deposited next, establishing a rectifying contact with area 1319. Depending on the characteristics of the area 1319 and the deposition of metal 1315, an interface at surface 1317 is formed to provide diode 1211 of FIG. 26. Polysilicon and conductive polymers are also contemplated to make rectifying contact instead of metal. The resistance of portion 1319 provides the programmable resistance 1213. The interface 1321 between conductive portion 1319 and the rest of polymer layer 1311 is electrically inactive for the purposes of this FIG. 27.

Figure 28:
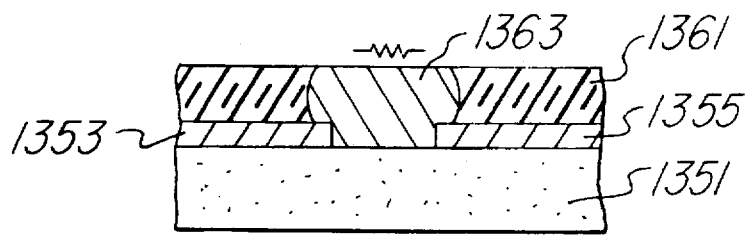
FIG. 28 is a cross-sectional view of a different structure for producing a programmable resistance in a gap between opposed ends of conductive material.

In FIG. 28, a substrate 1351 has opposed metal conductors 1353 and 1355 deposited thereon. Next, polymer 1361 is deposited over metal 1353 and 1355 and fills the space between their opposed ends. Irradiation then produces a programmable resistance 1363. A resistor in FIG. 28 symbolizes the programmability of the resistance 1363.

Figure 29:
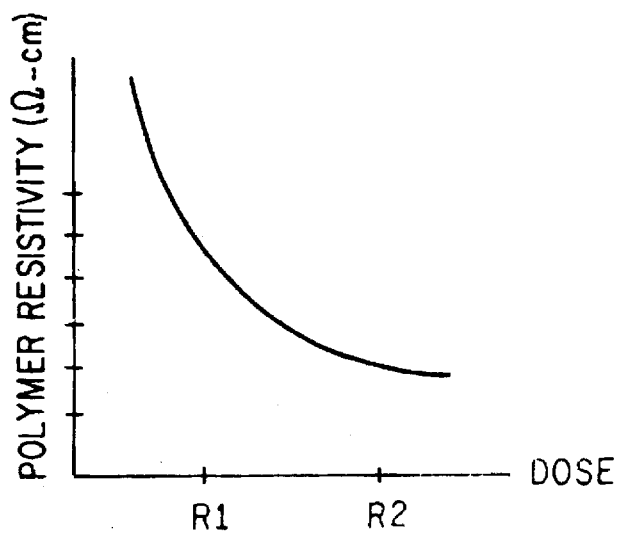
FIG. 29 is a graph of polymer resistivity versus radiation dose.

FIG. 29 shows a graph of polymer resistivity in ohm centimeters versus radiation dose at a given fluence (shot energy per unit area) of radiation. Below a dose of R1 the resistivity is higher than about 10 to the 16 ohm-cm. Higher doses between R1 and R2 radiation dose values program the resistivity over a range that can be orders of magnitude. Above the dose R2, the resistivity is further decreased only somewhat. A desired resistance of a connection or a programmable resistor or other element is determined by the dose R, the radiation fluence and geometric factors. Geometric factors include length l, width w, and thickness (depth) t of an irradiated region.

Experimental evidence in the present work demonstrates a permanent increase of the electrical conductivity of polymers induced by ultraviolet laser radiation. When polyimide (Kapton) or polybenzimidazole (PBI) are irradiated by a 248 nanometer (nm.) KrF (krypton fluoride) laser, the electrical conductivity permanently increases up to 15 or 16 orders of magnitude to a conductivity on the order of $1-10$ ohm$^{-1}$cm$^{-1}$. The laser induced conductivity increase depends on the fluence and the dosage and exhibits a fluence threshold of about 20 milliJoules cm$^{-2}$ per laser shot for polyimide.

The present work offers an uncomplicated process that establishes electrical conductivity as a continuous function of radiation parameters, and does not significantly compromise its mechanical and thermal properties. High ultraviolet absorption in the polymeric material leads to a good localization of the laser energy promising for the generation of conducting and semiconducting microstructures in the insulating polymer. Spatial resolutions less than 5 microns, 1 micron and 0.5 micron or less are offered by this new technology. Resolution determines the minimum dimensions of definable features such as structural elements or the spaces between them. With high resolution and high processing speeds, a process according to a preferred embodiment method herein is an advantageous complementary process or even an alternative process to present technology for producing integrated circuits. Thus, patterning of high temperature polymers by ultraviolet laser radiation is one form of the new process.

An experimental example used thin 50 micrometer foils 1385 of DuPont Kapton polyimide and similar foils of Hoechst Celanese PBI (Poly[2,2'-(m-phenylene)-5,5'-bibenzimidazole]). The foils 1385 were each in turn mounted in a sample holder 1387 which was rotated at a speed s of 10 revolutions per minute about the optical axis 1384 of the laser 1381 to ensure uniform irradiation, see FIG. 30. The rotating sample 1385 was irradiated in air by an injection controlled KrF excimer laser 1381 operated with repetition frequency of five (5) times per second. An article describing excimer lasers is by C. A. Brau, Topics in Applied Physics, Vol. 30, pp. 87–137, (C. K. Rhodes, ed.) Springer Verlag, Berlin, 1984. Other lasers with suitable parameters such as Argon fluoride (ArF) eximer lasers or solid state lasers (with doubler or tripler if needed) can also be used. The KrF excimer laser 1381 operates at 248 nm. with 30 nanosecond pulse width and an energy of approximately 600 milliJoules per shot. The radiation fluence at the sample 1385 was controlled by varying the distance between a f=−25 centimeter focal length diverging lens 1383 and the sample 1385. A plate 1389 with an inner edge 1391 defining an aperture exposed a square area of the foil 1385 of 4 millimeters on a side to laser radiation having fluences between 20 and 130 milliJoules per square centimeter.

The electrical conductivity of the nonirradiated samples was determined at room temperature using two cylindrical brass stamps or electrodes of 2.9 cm² smooth, flat, well-polished surface area and measuring the current-voltage characteristic of the sample located between these electrodes. Fine graphite powder is used to eliminate an irregular air layer between the electrode surface and the polymer. The stamps, with the sample between them, are pressed together by a pressure of approximately 10 newtons/cm². A variable DC voltage of up to 500 volts is applied to the electrodes, and current through the foil is measured with a sensitivity of 10 picoamperes. The conductivities determined for polyimide and PBI were $1 \times 10^{-15}$ ohm$^{-1}$cm$^{-1}$ and $1.5 \times 10^{-13}$ ohm$^{-1}$cm$^{-1}$, respectively. The dependence of the conductivity on the electric field up to a field strength of $4 \times 10$ V/cm was weak or negligible.

The dielectric constant epsilon of the foil is also measured with the above electrodes according to the equation:

$$\text{epsilon} = Cd/e_0 A$$

where A is the cross-sectional area of the electrodes, d is the foil thickness, C is the electrical capacitance, and $e_0$ (epsilon zero) is the dielectric constant of free space $8.85 \times 10^{-14}$ farads/cm).

The electrical sheet conductivity of the irradiated samples was measured using a four point probe technique, which is compatible with the 0.1 micrometer absorption length of 248 nm. radiation in polyimide. In the four point probe technique, a uniform current density is maintained between two razor blades mounted in parallel, defining an x direction along their lengths and separated about 3 millimeters. The voltage between two points between these two razor blades is measured by a digital voltage meter with an input resistivity exceeding 100 G ohms. Fine needles are used as probes separated by a distance y perpendicular to the x direction, the distance y being adjusted precisely by a micrometer screw. The conductivity is given by sigma=(y/U)(I/(dL)) where y is distance between the probes, U is the voltage between the probes, I is current through the sample, d is thickness of polymer layer, and l is length of razor blades. Experimentally, the voltage U is plotted versus the distance y between the probes. Conductivity sigma is obtained from the slope delta-U divided by delta-y (ratio of incremental change in voltage to incremental change in distance between probes). Then conductivity sigma is given by $$\text{sigma} = I/[(dL)(\text{delta}U/\text{delta } y)].$$

Figure 31:
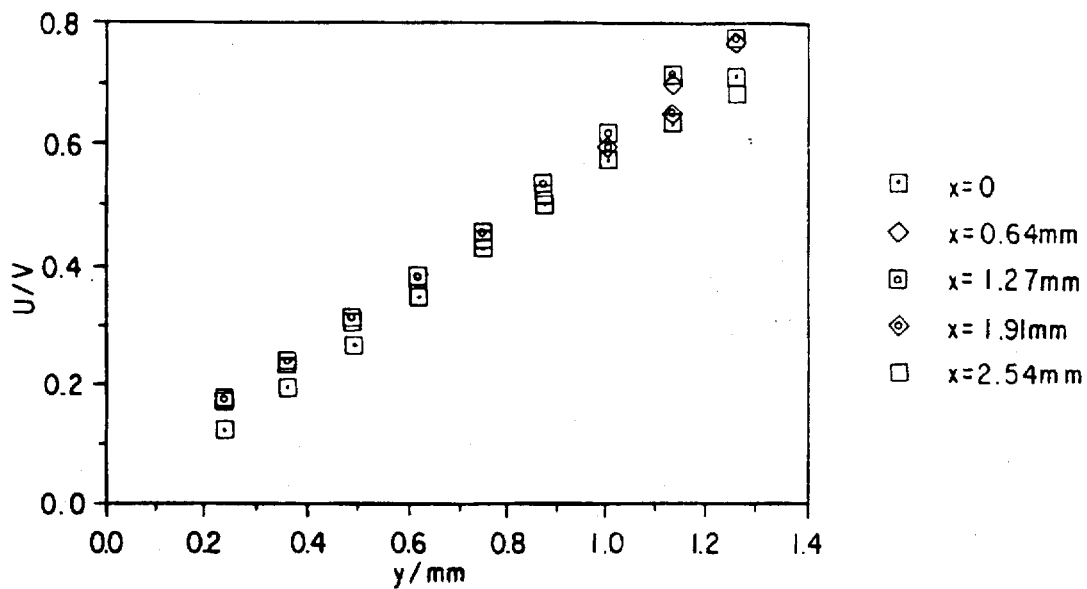
FIG. 31 is a graph of voltage across probes versus distance between probes in a conductivity measurement.

This four point method is effective for measuring conductivities greater than $10^{-7}$ ohm$^{-1}$cm$^{-1}$. In FIG. 31, a representative calculation involved a sample which was exposed to 3000 shots with a fluence of 132 mJ/cm². Current I is 186 microamperes. The voltage U versus distance y was measured at several positions x. The incremental ratio (delta U/delta y) was determined by calculating a linear fit using the averaged data and in this example was determined to 5.9 volts per centimeter. Conductivity sigma was computed accordingly to be 3.1 ohm$^{-1}$cm$^{-1}$. The accuracy of the measurement depends strongly on the conductivity of the investigated sample and the actual penetration depth of the radiation. The error is an order of magnitude for very low conductivities ($10^{-4}$ to $10^{-3}$ ohm$^{-1}$cm$^{-1}$) because the measurement is then very sensitive to mechanical variations of the setup. At higher conductivities (1 to 30 ohm$^{-1}$cm$^{-1}$) the error is only approximately plus/minus 20%.

Figure 32:
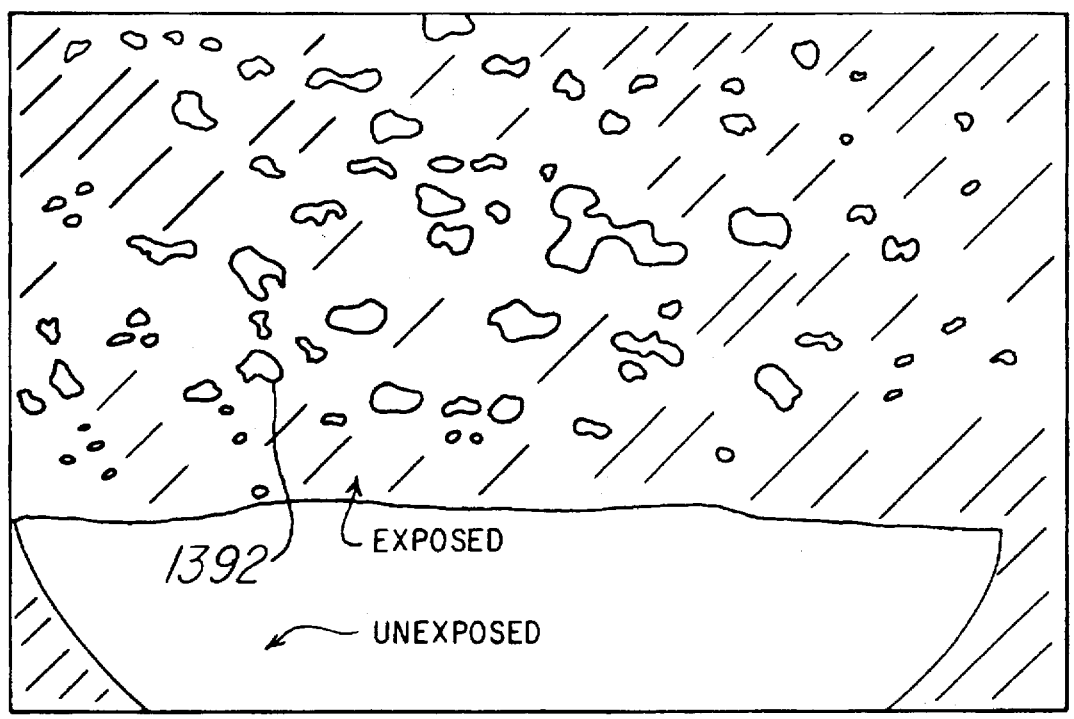
FIG. 32 is a sketch of a photomicrograph in plan view of a 4 mm square portion of an irradiated sample of polyimide.
Figure 33:
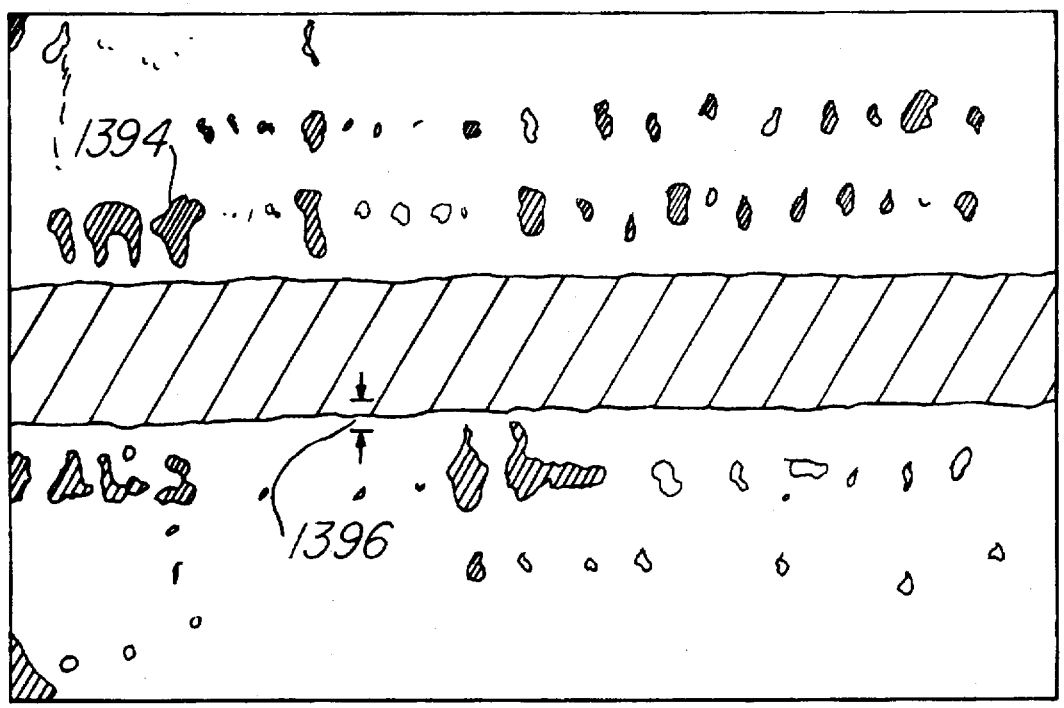
FIG. 33 is a sketch of a photomicrograph in plan view of the 4 mm square portion of an irradiated sample of polyimide when a slit has been interposed in the radiation, to establish a conducting line in the polyimide.

The morphology of the samples was investigated using optical microscopy. Two polyimide samples were both irradiated with a fluence of 80 mJ cm$^{-2}$ per pulse for 3000 shots so that they absorbed a total dosage of 240 J cm$^{-2}$. In FIG. 32 the area of a microscopic sample of 0.16 square centimeters is shown in a sketch of an optical microphotograph of laser irradiated polyimide at 500× magnification. FIG. 33 shows a polyimide sample irradiated through a 30 micrometer wide slit placed 7.5 millimeters in front of the sample. Cross-hatched regions of the polymer are electrically conducting. The microscopic sample of FIG. 32 shows distinct islands 1392 of what appears to be unaltered or molten and resolidified polyimide with a typical, almost fluence independent, size of 10 micrometers. These islands are almost completely absent on the polyimide of FIG. 33 irradiated through the 30 micrometer slit. Some stray regions 1394 are visible in FIG. 33, and are considerably smaller (less than or equal to 3 micrometers) and much less dense than the islands of FIG. 32. These stray regions 1394 are seen in three rows above and below the slit pattern, and are believed to result from diffraction of the laser radiation from the slit.

The transition from the conducting to the nonconducting region is in these experiments limited by the quality of the masks or slits and by diffraction. Nevertheless, FIG. 32 shows that the transition region from the conducting to the nonirradiated polymer occurs over a length scale 1396 of less than 5 micrometers and less than one micrometer. This indicates already a good localization of the deposited energy in the material. Given the penetration depth of the ultraviolet radiation in polyimide of about 0.1 micrometer, a resolution in the submicron range is indicated.

Figure 34A:
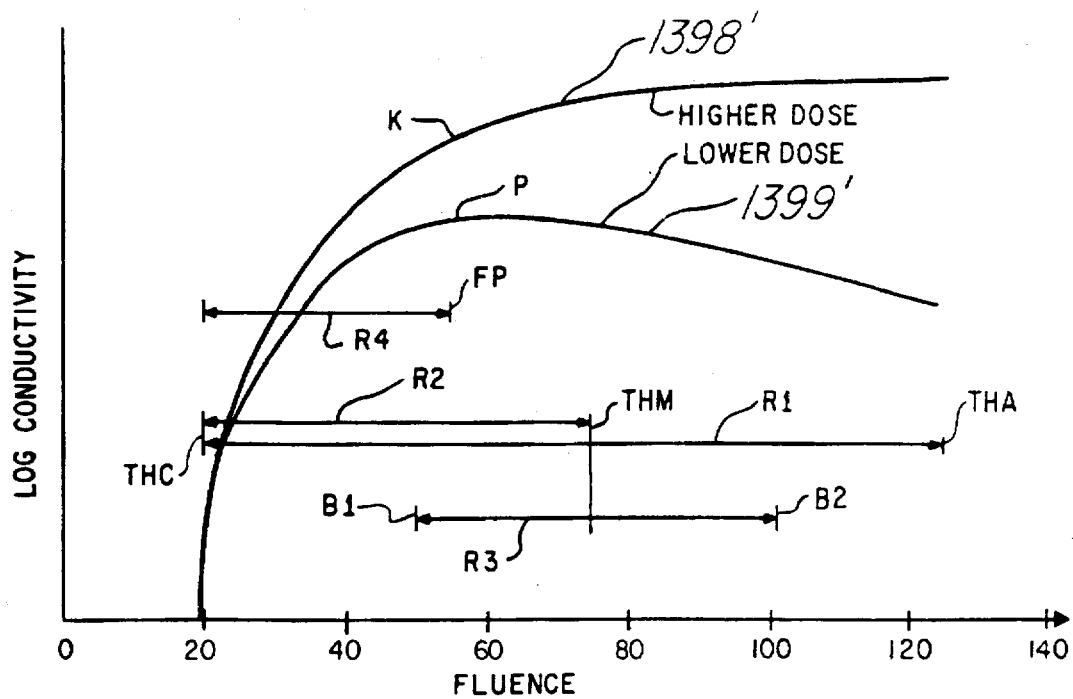
FIG. 34A is a graph of conductivity of an irradiated polymer versus fluence, showing two curves in a family of curves having dosage as a parameter.
Figure 34:
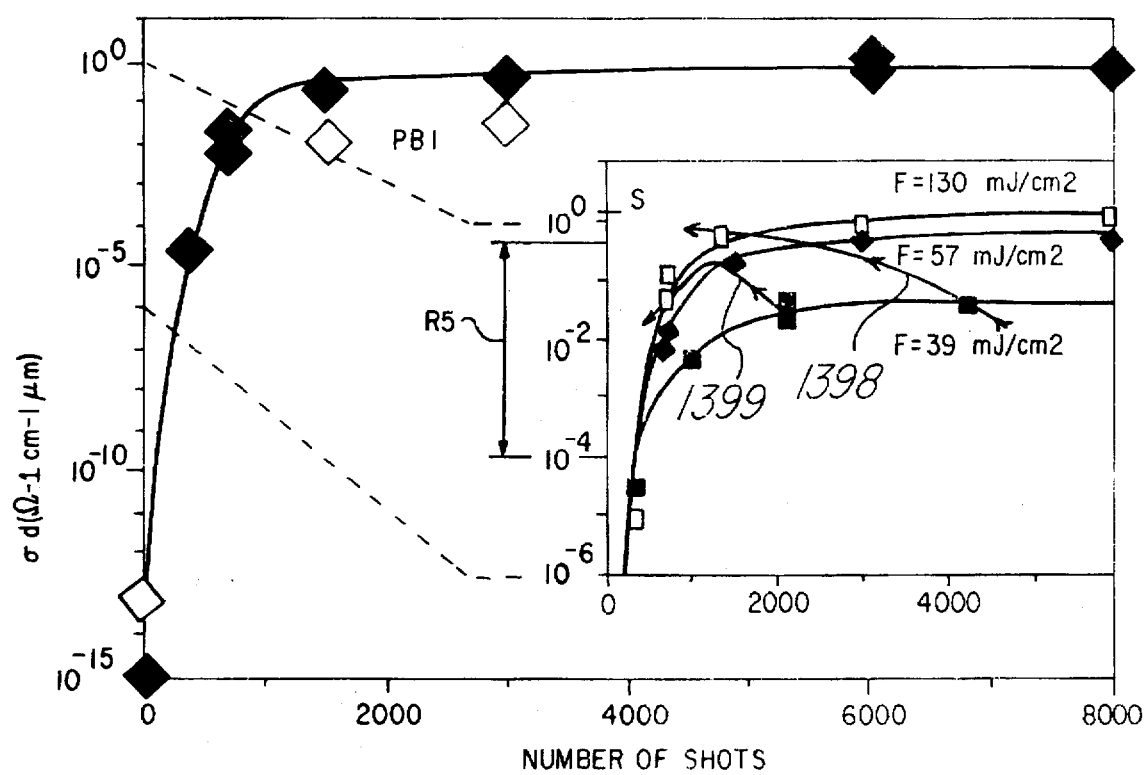
FIG. 34 is a graph of conductivity of an irradiated polymer sheet versus number of laser shots, including an inset of the same nature.

FIG. 34 shows the sheet conductivity of irradiated polyimide and PBI samples as a function of the number of the laser shots on the sample for three different fluences. In the larger graph, dark diamonds are polyimide data points, and open diamonds are PBI data points, for a fluence of 57 mJ cm$^{-2}$. The sheet conductivity of polyimide increases from $10^{-15}$ ohm$^{-1}$cm$^{-1}$ micrometer for the nonirradiated sample to $10^{-1}$ ohm$^{-1}$cm$^{-1}$ micrometer after 1500 laser shots to 1 ohm$^{-1}$cm$^{-1}$ micrometer after 6000 shots. A lower bound for the thickness of the conducting layer in the polymer sample is given by the penetration depth of 248 nanometer radiation in polyimide of 0.1 micrometer reported by J. H. Brannon et al. J. Appl. Phys. 58, 2036 (1985).

The samples were also cut perpendicular to the surface and investigated by optical microscopy. The thickness of the conducting layer could not be resolved optically, although it is clearly visible on the samples of FIG. 32. These facts imply an upper bound of one micrometer on the thickness of the conducting layer. The maximum conductivity in the saturation regime of FIG. 34, is therefore, between 1 and 10 ohm$^{-1}$cm$^{-1}$.

FIG. 34 (full size curve) shows the dramatic effect of laser irradiation on the conductivity of Kapton. The fluence is 57 mJ/cm². The conductivity of unirradiated Kapton was measured as $9.1 \times 10^{-16}$ ohm$^{-1}$cm$^{-1}$ plus/minus 10% at low fields less than $10^4$ volts per centimeter using the brass electrode system described above. After 6000 shots accumulate a dosage of 350 Joules/cm², and assuming a constant layer thickness of 42 nanometers, the conductivity is measured as 31 ohm$^{-1}$cm$^{-1}$. This implies a change of more than 16 orders of magnitude. (In comparison the conductivity of doped silicon at mean impurity concentrations ($10^{15}$–$10^{18}$ cm$^{-3}$) varies over only about three orders of magnitude—0.1 to 100 ohm$^{-1}$cm$^{-1}$.) The conduction mechanism is ohmic for low electrical fields up to 20 V/cm, used for the measurements.

The insert in FIG. 34 shows that the saturation conductivity of the sheet depends on the fluence per laser shot. As shown, sheet conductivity reaches a saturation level after about 2000 shots that depends on the fluence per pulse delivered to the sample. For less than 1000 shots the conductivity decreases sharply, almost independent of the fluence per shot. At the highest fluence of 130 mJ cm$^{-2}$, slow ablation of the polyimide film was observed. An increase of fluence between 60 mJ/cm$^2$ and the 130 value changes the conductivity at a given dosage only relatively modestly.

Figure 35:
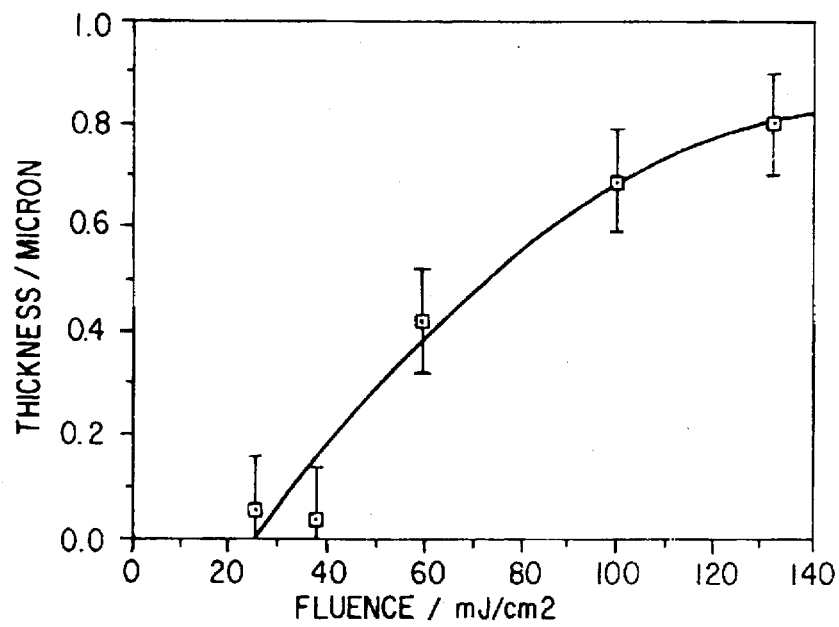
FIG. 35 is a graph of estimated thickness in tenths of a micron of a conductive layer produced by irradiation in a polymer sheet, graphed versus radiation fluence.

Estimated values for the layer thickness d are as shown in FIG. 35. The layer thickness d increases with fluence at the 248 nanometer laser wavelength to values around 0.5 micron and more.

Also shown in FIG. 34 are some experimental data for PBI. PBI sheet conductivity reaches a level about one order of magnitude below that of polyimide for the same fluence per shot of 57 mJ cm$^{-2}$. PBI appears to have a higher ablation threshold for ultraviolet radiation than polyimide, and is another important material alternative.

Figure 36:
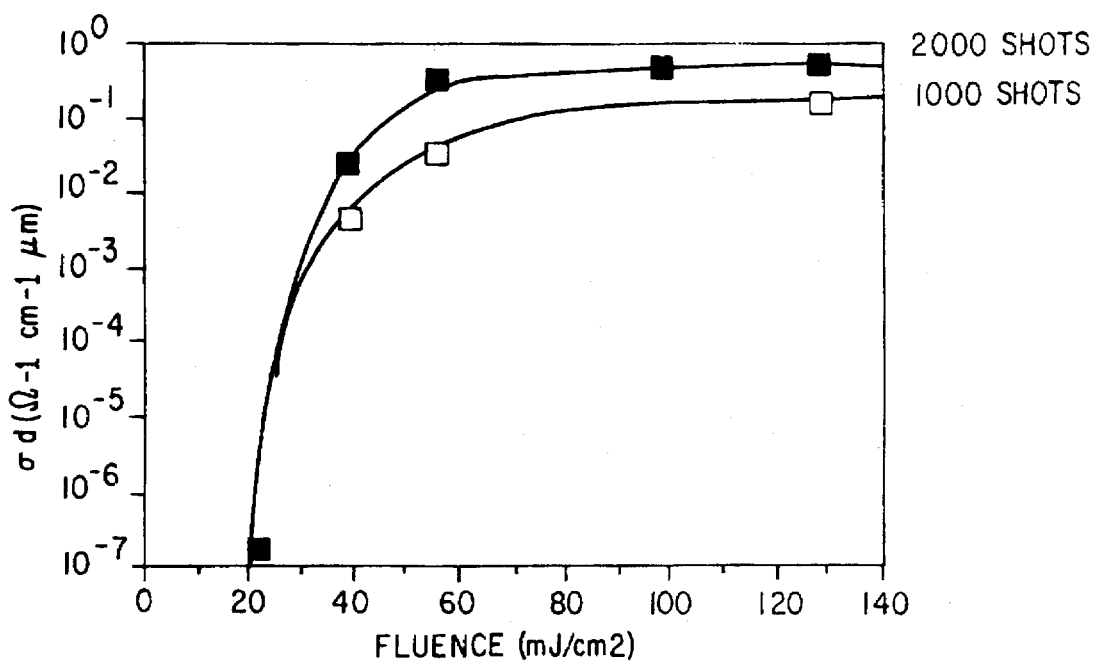
FIG. 36 is a graph of conductivity of the irradiated polymer sheet versus radiation fluence for two different numbers of laser shots.

In FIG. 36, the sheet conductivity of polyimide is shown as a function of the laser fluence for two different accumulated shot numbers. The laser induced conductivity exhibits a fluence conductivity threshold of about 20 mJ cm$^{-2}$. For fluences below this value, even a large number of laser shots (exceeding 2000) did not induce any sheet conductivity that was measurable by the four point probe technique which had a sensitivity threshold of about 10 ohm$^{-1}$cm$^{-1}$ micrometer. When the threshold fluence (conductivity threshold) for laser induced conductivity is well below the ablation threshold fluence, laser patterning to generate electrical structures in the material advantageously does not compromise the mechanical integrity of the material. This condition appears to be present for the materials used in the experimental observations. Above the conductivity threshold, the sheet conductivity increases with the total number of shots delivered. Also, the saturation conductivity rises with fluence. In FIG. 36 for fluences larger than approximately 50 mJ cm$^{-2}$ the sheet conductivity reaches a saturation value that depends on the total number of laser shots.

The maximum conductivities on the order 1–10 ohm$^{-1}$cm$^{-1}$ reached in the present experiments are associated with a mechanically and electrically stable black layer on the surface of the Kapton foil. The conductive layers that were made are observed to be mechanically hard because it is difficult to scratch them with metallic objects. The layer was not washed away by acetone, with moderate mechanical rubbing. The layer was only partly removed by strong rubbing with an acetone soaked tissue. The conductivity of several samples was remeasured 8 weeks after irradiation, and no change in the conductivity was found, although the samples were stored in normal laboratory air.

The experimental observations lead to some conclusions about advantageous characteristics of some preferred embodiment processes of integrated circuit fabrication. The radiation sensitive insulative material to be deposited as a layer should have an ablation threshold and a conductivity threshold to radiation wherein the ablation threshold exceeds the conductivity threshold. The material preferably has a resistivity which is alterable by irradiation over at least 15 orders of magnitude. Many of the materials such as polyimide, PBI and other polymers are insulators before irradiation. The material should be deposited to have a surface smoothness or uniformity compatible with subsequent layer deposition in integrated circuit manufacture. One definition of surface smoothness is variation in surface elevation in a localized area. A localized area can be taken as a region with a 100 micron width or a region of a circuit cell such as a memory cell when the latter is present. The surface should vary less than one micrometer and preferably less than one-half, one quarter or even one-tenth of a micrometer both before and after irradiation.

For high resolution or definition of conducting lines, areas and devices, selective irradiation of a radiation sensitive layer preferably uses radiation having a wavelength at least as short as ultraviolet. This is because resolvable feature size is generally proportional to wavelength.

Fluence herein is energy per shot per unit area. Dosage is fluence times number of shots. In general, fluence should be established at a value in a range R1 (FIG. 34A) between the ablation threshold THA and the conductivity threshold THC. These thresholds may depend on the pulse width and other factors and their values are suitably established in process development for manufacture according to the principles herein.

The graph of FIG. 34 inset has two conductivity curves 1398 and 1399 in a family of curves of constant dosage. FIG. 34A is a redrawing of the conductivity curves 1398 and 1399 as a function of fluence on the abscissa axis. The redrawn curves are designated 1398' and 1399'. Curve 1398' indicates that conductivity as a function of fluence (with dosage held constant at a high value) rises with fluence from conductivity threshold THC and then levels out until ablation threshold THE is reached. Thus there is a "knee" K in that function 1398'.

Curve 1399' indicates that with dosage held constant at a lower value, the conductivity rises with fluence from conductivity threshold THC to a peak P and then declines until the ablation threshold THE is reached. Thus, the most flexibility in obtaining various conductivities is provided at the peak P.

It is desirable to select both the fluence and dosage in order to obtain the desired conductivity with a minimum of physical modification to the surface geometry of the deposited layer. Generally, the lower the fluence for a given dosage, the less the surface departs from its initial smoothness. As the ablation threshold THE is approached, where sputtering material transport removal or ejection occurs, the surface will exhibit a greater depth of depression or dimpling or have clefts. In cases where only low conductivity is desired, the fluence can be maintained near the conductivity threshold THC. The surface in the experimental materials tests was found to remain quite durable, and for lower conductivities, the fluence would be fully satisfactory in a range R2 bounded by the conductivity threshold THC and a mean value THM equal to the arithmetic average (THM= (THA+THC)/2) of the ablation threshold THA and the conductivity threshold THC. Where the curve has a peak P, operation is sufficient in a range R4 between THC and a fluence value FP corresponding to peak ordinate value P. This is because the peak value P provides maximum freedom in setting the conductivity, and lower fluence apparently affects the surface geometry less.

When high conductivity is desired, the surface smoothness consideration in some applications may need to be balanced with the conductivity value desired. A good balance operates the process near the knee of the higher dosage fluence curve in a range R3 centered on the arithmetic average THM of the ablation threshold THA and the conductivity threshold THC and extending plus or minus 25% of the difference between the thresholds to bounds B1 and B2.

In many applications the radiation is suitably selected in dosage and fluence so that the conductivity in an irradiated part of the layer is in a range R5 of FIG. 34 between 0.01% of the saturation conductivity S and 50% of the saturation conductivity. This provides a wide range of conductivities for integrated circuit fabrication with almost complete isolation from the unirradiated dielectric surroundings which are 11 orders of magnitude or more below the 0.01% of saturation value at the low end of the range. In other applications, to be sure, any part or all of the full 15 or 16 or more orders of magnitude in conductivity can be utilized to advantage.

Intensity for purposes herein is the power per shot per unit area. In the experiments, the pulses were 600 mJ per shot with duration of 25-30 nanoseconds full width at half maximum (fwhm). The ratio of 600 mJ to 30 nanoseconds is 2 megawatts. Laser pulses are particularly useful which have an intensity in excess of ten kilowatts per square centimeter and preferably exceed one megawatt per square centimeter per shot. A pulse duration is desirably shorter than 0.1 millisecond and preferably shorter than one microsecond. Other process embodiments may use different intensities and pulse durations, however.

Figure 37:
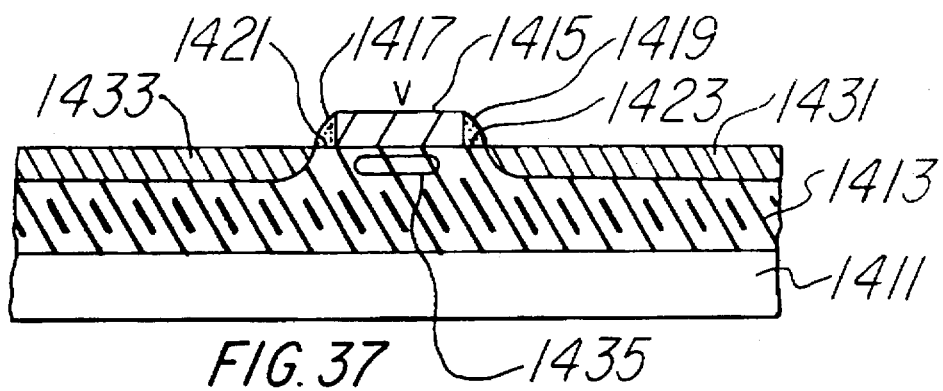
FIG. 37 is a cross-section of a field effect transistor made from radiation-sensitive material.

In FIG. 37 a field effect transistor 1401 is fabricated on a substrate 1411. First, a dielectric polymer film 1413 is laid down. Then a gate 1415 is deposited. Gate 1415 is suitably a metal such as aluminum in one embodiment. In another embodiment gate 1415 is polysilicon deposited at about 300 degrees Celsius. In still another embodiment, gate 1415 is a radiation sensitive material such as polyimide polymer or PBI as described extensively herein. Protective dielectric sidewalls 1417 and 1419 such as of silicon dioxide are optionally deposited on gate 1415. Then radiation is applied to film 1413 to form self-aligned conductive regions 1431 and 1433. Preliminary irradiation to a lesser degree is suitably also applied to the surface if needed so that region 1435 beneath gate 1415 can be switched into conduction when a gate voltage V is applied. Doping radiation or activation is suitably provided as described above in connection with doping. Depending on the fluence and dosage and on the thickness and other geometry of gate 1415, some radiation can reach region 1435 in the self-aligned radiation step after gate 1415 is applied and avoid the preliminary surface processing step just described. The resulting structure is a true dielectrically insulated transistor that is self aligned.

Figure 38:
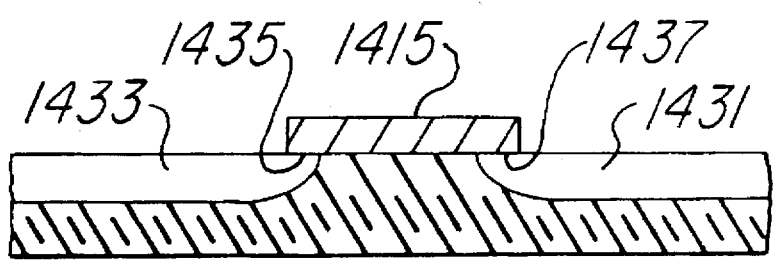
FIG. 38 is a cross-section of another field effect transistor made from radiation-sensitive material.

In an alternative embodiment shown in FIG. 38, the regions 1431 and 1433 are formed first, and doped so that when the gate 1415 is later deposited, rectifying junctions are present between gate 1415 and both regions 1431 and 1433. Reverse-biased diode action at interfaces 1421, 1423, 1435 and 1437 avoids conductive bridging by gate 1415 itself between conductive polymer portions 1431 and 1433. Applying a voltage to gate 1415 switches on a path of conduction between portions 1433 and 1431. Advantageously, this new polymer transistor offers high switching speed and dielectric isolation.

In still other embodiments a dye substance is included in the polymer or other substance, so that radiation is even more fully absorbed near the surface in preparation of nondielectric regions by selective irradiation. The dye is selected so that the absorption spectrum of the dye is coordinated with the wavelength of the radiation to be employed. In this way, the polymer and dye together act as an example of a radiation sensitive substance for use in IC and printed wiring board technology.

Thus, discrete structures according to various embodiments not only provide diodes and programmable resistors, but also active devices as well. A polymer materials system alternative in integrated circuit technology is thus established.

Figure 39:
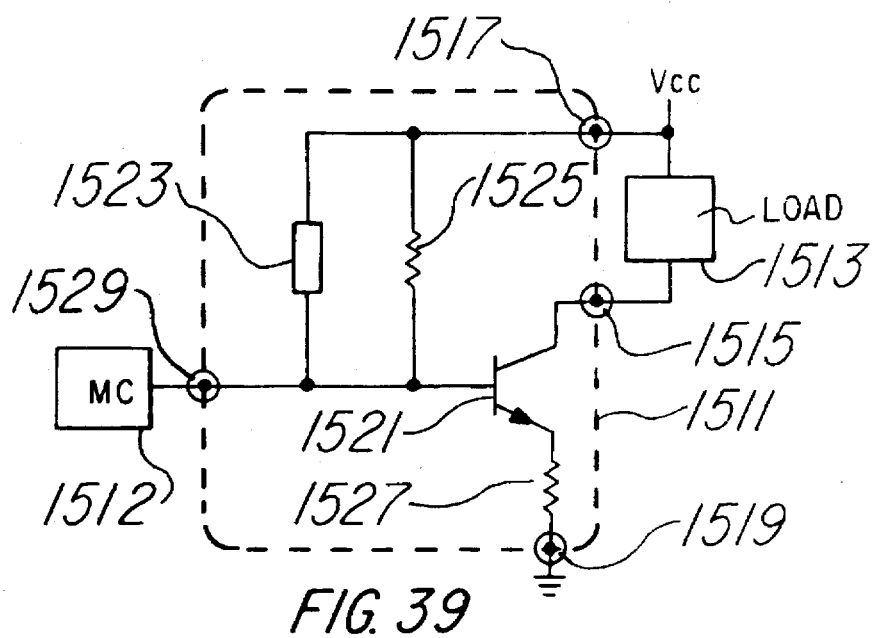
FIG. 39 is a schematic diagram of an integrated circuit for smart power switching.

In FIG. 39 a smart power switching circuit 1511 is connected to a load 1513 at terminal 1515. A supply voltage VCC is connected to the load at a terminal 1517 and a ground return at a terminal 1519 is also provided. NPN bipolar power transistor 1521 in circuit 1511 has its collector connected to load 1513 via terminal 1515. Transistor 1521 has its emitter connected to a resistance 1527 connected to terminal 1519. A base resistor 1525 shunted by a polymer trimming resistance 1523 is connected between terminal 1517 and the base of transistor 1521. A terminal 1529 provides access to the base of transistor 1521 from a microprocessor 1512, thus completing the smart power circuit.

Figure 40:
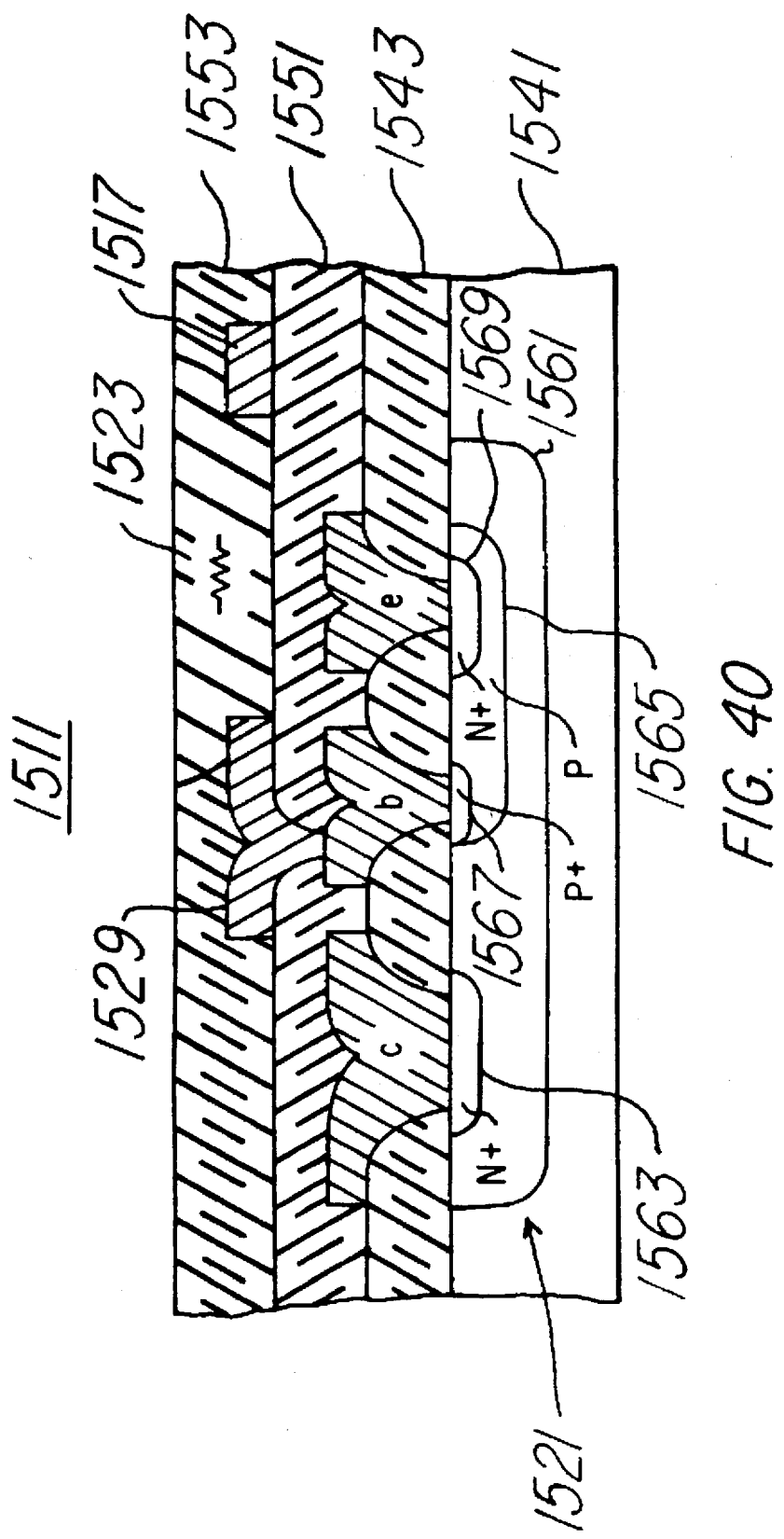
FIG. 40 is a microscopic cross-section of part of the integrated circuit of FIG. 39.

FIG. 40 shows a microscopic cross-section of some important parts of the circuit of FIG. 39. Silicon layer 1541 is overlayed with patterned dielectric 1543 having recesses in which conductors c, b and e for the collector, base and emitter of transistor 1521 are deposited. A further layer of dielectric 1551 has a recess into which conductor 1529 is deposited for access to the base. A conductor to terminal 1517 for supply voltage VCC is also deposited on dielectric 1551. Next a radiation sensitive layer 1553, e.g. polyimide, is applied. Radiation is selectively applied to produce a conductive region 1523 in the polyimide that establishes the trimming resistance 1523. Transistor 1521 is a bipolar transistor with a collector well 1561, n+ collector contact region 1563, a p-doped base region 1565 in well 1561 with p+ base contact region 1567, and a n+ emitter region 1569 surrounded by base region 1565.

FIG. 41 shows a cross-section illustrating radiation-dosed polymer connections for polyimide and PBI field effect transistors and other types of transistors. In FIG. 42 a plan view of regions of deposition and irradiation illustrates the process of fabrication of the structure of FIG. 41.

In FIGS. 41 and 42 transistor 1401 with parts 1433, 1415 and 1431 is constructed as described in connection with FIG. 37 or FIG. 38. Analogous transistors with parts 1613, 1615, 1611 and 1623, 1625, 1621 are repeated in FIG. 41. A dielectric layer is deposited and patterned into regions 1631, 1633, 1635 and 1637. Next a polyimide or PBI layer is applied. Initially it is entirely dielectric as in region 1641 thereof. After selective irradiation, the polyimide has conductive regions 1643 and 1645 with dielectric region 1641 remaining. Conductive region 1645 electrically connects polymer sources 1433 and 1613. Gates 1415, 1615 and 1625 are dielectrically isolated and connections to them are made by structures deeper in the plane of the drawing and unnecessary to illustrate for the present purposes. Similarly, drains 1431, 1611 and 1621 extend into the plane of the drawing and are connected to other structures. Conductive region 1643 suitably connects source 1623 to one or more other structures laterally in the drawing, and not shown.

In FIG. 42 vertically oriented rectangular gates 1615 and 1625 appear in the illustration. "d" shaped zones of radiation dosage 1651 and 1653 form self-aligned conductive polymer sources and drains 1613, 1611, 1623 and 1621 and provide upward-directed stems of conducting path to make connections elsewhere as desired. Block shaped zones of radiation dosage subsequently form conductive polymer regions 1643 and 1645.

FIGS. 43–44 further illustrate the flexibility of the polymer fabrication technology disclosed herein. Transistor 1401 of either FIGS. 37 or 38 is implemented in polymer 1411, with its polymer source 1433, polymer drain 1431 and gate 1415. Gate 1415 is irradiated polymer, polysilicon, metal or any other suitable conductor. Analogous transistors 1733, 1715, 1731 and 1731, 1745, 1751 are provided across the illustrated structure. Advantageously, interconnection between the two latter transistors is provided by the region 1731, simplifying the structure. Owing to the self-alignment approach wherein the gates 1715 and 1745 mask the regions beneath them respectively, a single rectangular zone 1795 of radiation dosage in FIG. 44 suffices to make sources, drains and an interconnection in polymer such as polyimide or PBI.

Further in FIG. 43, a dielectric layer is applied and patterned to form dielectric regions 1761, 1763, 1765, 1767, 1769 and 1771. Conductors of polyimide or metal or other suitable conductor are fabricated as elements 1781, 1783, 1785 and 1787. Conductive element 1783 connects drain 1431 to source 1733 and provides access from above. Conductive region 1731 is particularly advantageous when access from above is unnecessary; and a conductive element 1785 is provided to contact region 1731 when access from above is desired.

Figure 45:
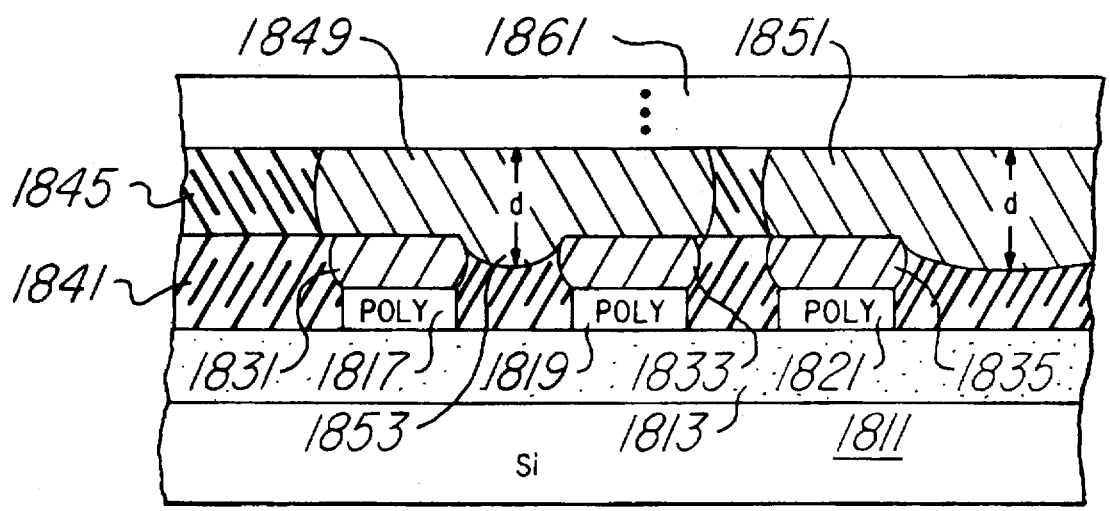
FIG. 45 is a microscopic cross-section of an integrated circuit with adjacent layers of radiation-sensitive patterned material.

In FIG. 45, a silicon substrate 1811 has a layer of field oxide 1813 deposited thereon. Polysilicon conductors 1817, 1819 and 1821 are provided on the layer 1813. Spin-on polymer 1841 overlies the polysilicon conductors 1817, 1819 and 1821. Patterning of polymer 1841 by radiation as described hereinabove, develops conductive regions 1831, 1833 and 1835 for electrical connection to the polysilicon conductors respectively. Advantageously, the polymer 1841 is compatible with further deposition of radiation sensitive polymer layer 1845 directly on layer 1841. Transverse link regions 1849 and 1851 are irradiated into the layer 1845. Link 1849 conductively connects the conductive portions 1831 and 1833 thereby interconnecting the polysilicon conductors 1817 and 1819. Link 1851 connects portion 1835 to other circuitry, not shown. The conductive portions in layer 1845 are irradiated to a penetration depth d and an area 1853 bulges into the polymer 1841 with no deleterious effect. The thickness of each layer such as 1845 is coordinated with the penetration depth so that connections are made or avoided as desired for any particular circuit. The structure described in FIG. 45 is useful in an SRAM (static random access memory cell for example.

In FIG. 45, any number of further polymer layers 1861 can be laid down, to fabricate interconnected or isolated integrated circuits in inexpensive uncomplicated three-dimensional device fabrication processes. In still other embodiments, multiple layers of the same polymer or other radiation sensitive material are deposited, radiatively patterned, layer by layer free of structures in any other materials system.

While the microstructural arrangements of FIGS. 41–45 are illustrative, the figures are also illustrative of some geometric and dimensional considerations that are exemplary. Accordingly, the dimensions, proportions, dimensional ratios, aspect ratios, separation dimension to structure dimension ratios, and lineal density, area density and volume density of structures depicted in the figures are also illustrative of some embodiments. Electric field strengths can be estimated assuming a V volt supply voltage and a drawing proportion of m microns per centimeter of actual drawing space. In one example of voltage V=1 volt, and in another example V=5 volts. In an example of proportion m=0.3 and in another example m=1. The dielectric constant of polyimide depends on the chemical composition used, and an approximate value of dielectric constant is 2.8–3.5, providing advantageously low capacitances in integrated circuit design. Resolution of the mask or other circuit imaging apparatus depends on the wavelength of radiation or radiations used in the various stages of the fabrication process, and separation dimensions between source, mask and workpiece. Projection systems also offer desirable resolution. When desired, penetration depth is varied by using different wavelengths, fluences, dosages or other differing parameters of radiation on the same workpiece. Because deep ultraviolet and soft x-rays can be used with some radiation sensitive materials, the attainable resolution and consequent structural definition is advantageously high, extending well below one micron and even below a tenth micron. Further process advantages conferred by various embodiments include fewer processing steps, high potential reliability, and relatively low processing temperatures.

The structures and methods are applicable to fabrication of capacitors, resistors, bipolar and field effect transistors, photodiodes, phototransistors, radiation sensors, capacitive sensors, humidity sensors and other types of sensors, light emitting diodes, thyristors, and all of the various passive and active devices to which their advantages commend them.

Substrates which are physically compatible with polyimide, PBI and other radiation responsive polymer or other films include silicon, gallium arsenide, glass, ceramic, metal, and any other substrate materials preferably compatible in adhesion and thermal expansion properties which the skilled worker selects for this purpose. Radiation as used herein includes any radiant energy or particle radiation to which a dielectric substance is responsive to provide a conductive region or to which a conductive substance is responsive to provide a less conductive or dielectric region. Photon or electromagnetic radiation includes x-rays, gamma rays, ultraviolet, visible light, and infrared. Particle radiation includes electrons, ions and other particles such as subatomic particles. Radiation also includes ultrasonic vibrations, and any other forms of energy or matter for transforming a radiation sensitive material to make part of it conduct or insulate. Materials having this sensitivity include polyimides, PBI, other polymers, other organic dielectrics, conductors and semiconductors, and other sensitive substances.

In another example, a 15 micrometer-thick polyvinyl chloride (PVC) foil was tested in another experiment in the present work. Transmittance of the PVC decreased with increasing dosage at 248 nm. from about 80% to 20% between 0 and 400 shots with fluence of 18 mJ/cm$^2$ per shot. A visible mistyness and darkening of the foil was evident. A higher dose would damage the foil. Using the brass electrode measurement scheme, the unirradiated foil was determined to be ohmic. Using the four-point technique, at fields up to $4 \times 10^5$ volts/cm., irradiation decreases the electrical resistivity of the PVC foil by a factor of 20. The current-voltage relationship for irradiated PVC foil is no longer linear (ohmic) and conductivity increases exponentially instead. All measurements were within a tolerance of plus/minus 10% reproducible. No significant change of the dielectric constant due to irradiation was observed within the experimental accuracy.

It is contemplated that interconnects, resistances, capacitors, diodes, transistors and other elements be provided according to the processes and structures disclosed herein in integrated circuits of any type to which their use commends them, such as ROMs, RAM (random access memory) such as DRAM (dynamic RAM), and video RAM (VRAM), PROMs (programmable ROM), EPROM (erasable PROM), EEPROM (electrically erasable PROM), EAROM (electrically alterable ROM), caches, and other memories, and to microprocessors and microcomputers in all circuits including ALUs (arithmetic logic units), control decoders, stacks, registers, input/output (I/O) circuits, counters, to general purpose microcomputers, RISC (reduced instruction set computing), CISC (complex instruction set computing) and VLIW (very long instruction word) processors, and to analog integrated circuits such as digital to analog converters (DACs) and analog to digital converters (ADCs). ASICS, PLAs, PALs, gate arrays and specialized processors such as digital signal processors (DSP), graphics system processors (GSP), synchronous vector processors (SVP), image system processors (ISP), as well as testability and emulation circuitry for them, all represent sites of application of the principles and structures disclosed herein. Still other larger scale applications include photocopiers, printers, modems and other telecommunications equipment, calculators, radio and television circuitry, microwave oven controls, automotive microcontrollers, and industrial controls.

Some application circuits for use of the radiation sensitive processing and structures are described in the following coassigned U.S. patents and applications which are hereby incorporated by reference: For an example of a DSP with ROM and RAM—U.S. Pat. No. 4,577,282 filed Feb. 22, 1982 (TI-9062) and patent application Ser. No. 347,596, filed May 4, 1989, U.S. Pat. No. 5,072,418 (TI-14080); an example of ISP in printers, photocopiers and facsimile machines—patent application Ser. No. 435,591 filed Nov. 17, 1989 (TI-14608); an example of SVP—U.S. Pat. No. 4,939,575 filed Sep. 5, 1989, (TI-13117C); an example of microcontroller with DRAM—U.S. Pat. No. 4,459,660 filed Apr. 13, 1981, (TI-8629); an example of a VRAM—U.S. Pat. No. 4,562,435 filed Sep. 29, 1982, (TI-9061); an example of a calculator and other applications—U.S. Pat. No. 3,991,305 filed Nov. 19, 1974, (TI-5325); an example of a GSP—patent application Ser. No. 387,568 filed Jul. 28, 1989, U.S. Pat. No. 5,233,690 (TI-13495); an example of a microwave oven controller—U.S. Pat. No. 4,158,432 filed Dec. 10, 1976 (TI-6660). It is specifically contemplated that the structures and processes described herein be used according to the principles disclosed herein to make the interconnections, resistors, capacitors, diodes, transistors, and other circuit elements of the systems shown in these incorporated documents and all other systems to which their advantages commend them.

A few preferred embodiments have been described in detail hereinabove. It is to be understood that the scope of the invention comprehends embodiments superficially different from those described yet within the inventive scope. For a few examples, color display devices utilized in combination can be raster-scanned cathode ray tube monitors, other raster-scanned devices, devices that are not raster-scanned and have parallelized line or frame drives, color printers, film formatters, and other hard copy displays, liquid crystal, plasma, holographic, deformable micromirror, and other displays of non-CRT technology, and three-dimensional and other nonplanar image formation technologies. Microprocessor and microcomputer in some contexts are used to mean that microcomputer requires a memory; the usage herein is that these terms can also be synonymous and refer to equivalent things. The phrase processing circuitry comprehends ASIC circuits, PALs, PLAs, decoders, memories, non-software based processors, or other circuitry, or digital computers including microprocessors and microcomputers of any architecture, or combinations thereof. Internal and external connections can be ohmic, capacitive, direct or indirect via intervening circuits or otherwise as desirable. Implementation is contemplated in discrete components or fully integrated circuits in silicon, gallium arsenide, and other electronic materials families as well as in optical-based or other technology-based forms and embodiments. It should be understood that various embodiments of the invention can employ hardware, software or microcoded firmware. Process diagrams herein are also representative of flow diagrams for microcoded and software based embodiments.

While this invention has been described with reference to illustrative embodiments, this description is not intended to be construed in a limiting sense. Words of inclusion are to be interpreted as nonexhaustive in considering the scope of the invention. Various modifications and combinations of the illustrative embodiments, as well as other embodiments of the invention, will be apparent to persons skilled in the art upon reference to this description. It is therefore contemplated that the appended claims cover any such modifications or embodiments as fall within the true scope of the invention.

What is claimed is:

1. A smart power device comprising a microcontroller, a power switching device activated by a signal from said microcontroller, and an electrical resistance body of radiatively dosed radiation sensitive material electrically connected within the power switching device, said electrical resistance body comprising a polymer material.

2. The smart power device of claim 1 wherein said power switching device includes a power transistor.

3. The smart power device of claim 1 wherein said power switching device includes a layer having semiconductive doped regions, a second layer having conductive contacts to the semiconductive doped regions, the radiation sensitive material disposed as a third layer over the second layer and electrically connecting to at least one of the conductive contacts.

4. The device of claim 1 wherein the radiation sensitive material comprises a polybenzimidazole (PBI) material.

5. The device of claim 1 wherein the radiation sensitive material is also doped.

6. The device of claim 1 wherein said radiation sensitive material is sensitive to soft x-rays and has an ablation threshold of fluence of soft x-rays and a conductivity threshold of fluence of soft x-rays which is less than its ablation threshold.

7. The device of claim 1 wherein said radiation sensitive material is substantially an electrical insulator that increases in conductivity when exposed to a radiation to which it is sensitive.

8. The device of claim 1 wherein the radiation sensitive material comprises a polyimide.

9. A power controller system comprising a microcontroller, a power switching device activated by a signal from said microcontroller, an electrical resistance body of radiatively dosed radiation sensitive polymer material electrically connected to the power switching device, and a load element connected to said power switching device and to said electrical resistance body.

10. The system of claim 9 wherein said power switching device includes a power transistor.

11. The system of claim 9 wherein the radiation sensitive material comprises a polybenzimidazole (PBI) material.

12. The system of claim 9 wherein the radiation sensitive material is also doped.

13. The system of claim 9 wherein said radiation sensitive material is sensitive to soft x-rays and has an ablation threshold of fluence of soft x-rays and a conductivity threshold of fluence of soft x-rays which is less than its ablation threshold.

14. The system of claim 9 wherein said radiation sensitive material is substantially an electrical insulator that increases in conductivity when exposed to a radiation to which it is sensitive.

15. The system of claim 9 wherein the radiation sensitive material comprises a polyimide.

16. A smart power switching circuit comprising:

a microcontroller;

a bipolar transistor having an emitter, a base and a collector, said base coupled to said microcontroller;

a first resistive element coupled between said emitter and a reference voltage node;

a second resistive element coupled between said base and a supply voltage node; and an electrical resistance body of a radiatively dosed radiation sensitive polymer material coupled between said base and said supply voltage node.

17. The circuit of claim 16 wherein said bipolar transistor comprises an NPN transistor.

18. The circuit of claim 16 and further comprising a load coupled between said collector and said supply voltage node.

19. The circuit of claim 16 wherein the radiation sensitive material comprises a polybenzimidazole (PBI) material.

20. The circuit of claim 16 wherein the radiation sensitive material is also doped.

21. The circuit of claim 16 wherein said radiation sensitive material is sensitive to soft x-rays and has an ablation threshold of fluence of soft x-rays and a conductivity threshold of fluence of soft x-rays which is less than its ablation threshold.

22. The circuit of claim 16 wherein said radiation sensitive material is substantially an electrical insulator that increases in conductivity when exposed to a radiation to which it is sensitive.

23. The circuit of claim 16 wherein the radiation sensitive material comprises a polyimide.

24. A method for forming a smart power switching circuit comprising the steps of:

providing a microcontroller;

providing a bipolar transistor having an emitter, a base and a collector, said base coupled to said microcontroller;

coupling a first resistive element between said emitter and a reference voltage node;

coupling a second resistive element between said base and a supply voltage node; and forming an electrical resistance body of radiatively dosed radiation sensitive polymer material coupled between said base and said supply voltage node.

25. The method of claim 24 wherein said step of providing a bipolar transistor comprises providing an NPN transistor.

26. The method of claim 24 and further comprising the step of coupling a load between said collector and said supply voltage node.

27. The method of claim 24 wherein said radiation sensitive material comprises a polybenzimidazole (PBI) material.

28. The method of claim 24 wherein said radiation sensitive material is doped.

29. The method of claim 24 wherein said radiation sensitive material is sensitive to soft x-rays and has an ablation threshold of fluence of soft x-rays and a conductivity threshold of fluence of soft x-rays which is less than its ablation threshold.

30. The method of claim 24 wherein said radiation sensitive material is substantially an electrical insulator that increases in conductivity when exposed to a radiation to which it is sensitive.

31. The method of claim 24 wherein the radiation sensitive material comprises a polyimide.

* * * * *